United States Patent
Sato et al.

(10) Patent No.: US 8,207,659 B2
(45) Date of Patent: Jun. 26, 2012

(54) LIGHT EMITTING DEVICE AND LIGHT EMITTING APPARATUS

(75) Inventors: Takahiro Sato, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 179 days.

(21) Appl. No.: 12/548,772

(22) Filed: Aug. 27, 2009

(65) Prior Publication Data

US 2010/0052504 A1     Mar. 4, 2010

(30) Foreign Application Priority Data

Aug. 29, 2008   (JP) ................. 2008-221593

(51) Int. Cl.
  *H01J 1/62*     (2006.01)
  *H01J 63/04*    (2006.01)
  *H01L 33/00*    (2010.01)
(52) U.S. Cl. ............... 313/483; 257/98; 257/100
(58) Field of Classification Search ........... 313/483; 257/98, 100
  See application file for complete search history.

(56) References Cited

U.S. PATENT DOCUMENTS

| | | | | |
|---|---|---|---|---|
| 5,847,507 A * | 12/1998 | Butterworth et al. | ......... | 313/512 |
| 6,011,277 A * | 1/2000  | Yamazaki | ......... | 257/66 |
| 7,105,863 B1 * | 9/2006 | Ng et al. | ......... | 257/99 |
| 2005/0206301 A1 * | 9/2005 | Ng | ......... | 313/501 |
| 2006/0065907 A1 | 3/2006 | Lee et al. | | |
| 2006/0097245 A1 * | 5/2006 | Aanegola et al. | ......... | 257/26 |
| 2006/0170332 A1 * | 8/2006 | Tamaki et al. | ......... | 313/498 |
| 2006/0172148 A1 * | 8/2006 | Murayama et al. | ......... | 428/690 |
| 2008/0303426 A1 | 12/2008 | Iwanaga et al. | | |
| 2009/0050851 A1 | 2/2009 | Sato et al. | | |

FOREIGN PATENT DOCUMENTS

| | | |
|---|---|---|
| JP | 2007-1880 | 1/2007 |
| JP | 3978102 | 6/2007 |
| JP | 2007-317787 | 12/2007 |

OTHER PUBLICATIONS

U.S. Appl. No. 12/874,778, filed Sep. 2, 2010, Saito, et al.
U.S. Appl. No. 13/033,911, filed Feb. 24, 2011, Ishida, et al.

* cited by examiner

*Primary Examiner* — Toan Ton
*Assistant Examiner* — Zachary Snyder
(74) *Attorney, Agent, or Firm* — Oblon, Spivak, McClelland, Maier & Neustadt, L.L.P.

(57) ABSTRACT

A light emitting device, includes: a light source; a first wavelength conversion unit absorbing a light-source light radiated by the light source and radiating a first light, a wavelength of the first light being different from a wavelength of the light-source light; and a second wavelength conversion unit dispersedly provided in the first wavelength conversion unit, the second wavelength conversion unit absorbing the light-source light and radiating a second light. An absorptance of the light-source light in the second wavelength conversion unit is higher than an absorptance of the light-source light in the first wavelength conversion unit. A wavelength of the second light is different from the wavelength of the light-source light and different from the wavelength of the first light.

22 Claims, 12 Drawing Sheets

LIGHT EMITTING DEVICE AND LIGHT EMITTING APPARATUS

CROSS-REFERENCE TO RELATED APPLICATIONS

This application is based upon and claims the benefit of priority from the prior Japanese Patent Application No. 2008-221593, filed on Aug. 29, 2008; the entire contents of which are incorporated herein by reference.

BACKGROUND OF THE INVENTION

1. Field of the Invention

This invention relates to a light emitting device and a light emitting apparatus.

2. Background Art

Light emitting elements such as LEDs (Light Emitting Diodes) provide highly energy-efficient light sources and are widely used in illumination and display devices to replace incandescent lightbulbs for energy conservation and the like. In recent years, devices emitting white light with high luminous flux are drawing attention as replacements for fluorescent tubes.

A semiconductor light emitting element used in an LED generally emits light in a designated wavelength region such as blue, green, or red. Therefore, the light produced by a light emitting element can be used to emit light having a white or intermediate color by performing wavelength conversions by fluorescent materials. In other words, multiple types of fluorescent materials which emit light in designated wavelength regions such as blue, green, yellow, and red can be used to emit light having a white or intermediate color.

In such a case, known methods dispose adjacent fluorescent material layers that emit light of different wavelengths, and known structures have stacked fluorescent material layers with light transmitting layers therebetween. However, when using such methods providing multiple layers, luminous flux is low due to reflections of light at interfaces between layers and light refraction between layers having different refractive indexes. Moreover, although it is generally necessary to disperse an inorganic granular fluorescent material in a transparent material such as epoxy resin or silicone resin to form multiple layers including fluorescent materials by such methods, control of the dispersion state is difficult, and manufacturing processes become undesirably complex.

Therefore, one proposed configuration covers an LED with fluorescent glass having fluorescent material grains mixed therein to emit red, green, and blue light (JP 3978102). However, no consideration is given to the absorptance of the fluorescent glass and the fluorescent material grains. Therefore, there is room for improvement in regard to conversion efficiency.

SUMMARY OF THE INVENTION

According to an aspect of the invention, there is provided a light emitting device, including: a light source; a first wavelength conversion unit absorbing a light-source light radiated by the light source and radiating a first light, a wavelength of the first light being different from a wavelength of the light-source light; and a second wavelength conversion unit dispersedly provided in the first wavelength conversion unit, the second wavelength conversion unit absorbing the light-source light and radiating a second light, an absorptance of the light-source light in the second wavelength conversion unit being higher than an absorptance of the light-source light in the first wavelength conversion unit, and a wavelength of the second light being different from the wavelength of the light-source light and different from the wavelength of the first light.

According to another aspect of the invention, there is provided a light emitting apparatus, including: a light emitting device; and an electronic circuit, the light emitting device including: a light source; a first wavelength conversion unit absorbing a light-source light radiated by the light source and radiating a first light, a wavelength of the first light being different from a wavelength of the light-source light; and a second wavelength conversion unit dispersedly provided in the first wavelength conversion unit, the second wavelength conversion unit absorbing the light-source light and radiating a second light, an absorptance of the light-source light in the second wavelength conversion unit being higher than an absorptance of the light-source light in the first wavelength conversion unit, and a wavelength of the second light being different from the wavelength of the light-source light and different from the wavelength of the first light, and the electronic circuit being connected to the light source to supply a current to the light source.

DETAILED DESCRIPTION OF THE INVENTION

Description of the Preferred Embodiments

Figure 1:
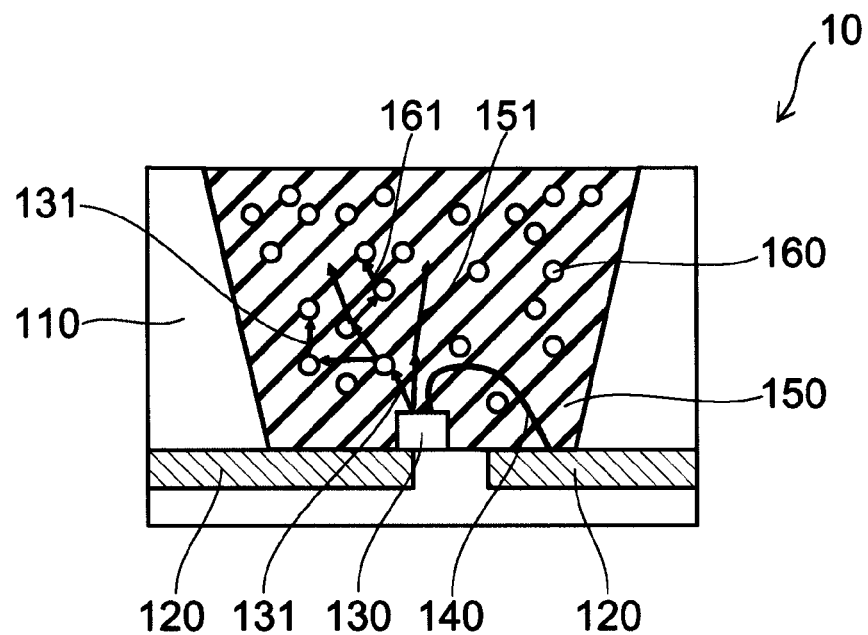
FIG. 1 is a schematic cross-sectional view illustrating the configuration of a light emitting device according to a first embodiment of the invention.

Embodiments of the invention will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating the configuration of a light emitting device according to a first embodiment of the invention.

In the light emitting device 10 according to the first embodiment of the invention illustrated in FIG. 1, a package 110 contains a light source 130 and fluorescent materials. An electrode unit 120 is provided in the package 110 to provide a current to the light source 130. Wiring 140 is provided to connect the light source 130 and the electrode unit 120.

The fluorescent materials include a first fluorescent material (first wavelength conversion unit) 150 and a second fluorescent material (second wavelength conversion unit) 160. The second fluorescent material 160 is multiply dispersed in the first fluorescent material 150. In other words, the first fluorescent material 150 exists around the dispersed second fluorescent material 160.

The second fluorescent material 160 has a higher absorptance than the first fluorescent material 150 with respect to a light-source light 131 radiated by the light source 130.

Thereby, the light-source light 131 radiated by the light source 130 can pass through an interior of the first fluorescent material 150, which has a low absorptance with respect to the light-source light 131, to reach the second fluorescent material 160, which has a high absorptance with respect to the light-source light 131.

Thereby, one portion of the light-source light 131 undergoes a wavelength conversion by the first fluorescent material 150 to radiate a first light 151. Another portion of the light-source light 131 reaches the second fluorescent material 160 and undergoes a wavelength conversion to radiate a second light 161.

At this time, the light-source light 131 that remains after not being absorbed by the first fluorescent material 150 and the second fluorescent material 160 once again passes through the first fluorescent material 150 and the second fluorescent material 160. The remaining light-source light 131 that is not absorbed is then absorbed by the first fluorescent material 150 and the second fluorescent material 160, and the first fluorescent material 150 and the second fluorescent material 160 radiate the first light 151 and the second light 161, respectively. This action is repeated.

In the light emitting device according to this embodiment, the second fluorescent material 160 is multiply dispersed in the first fluorescent material 150. Therefore, although one portion of the light-source light 131 is absorbed upon reaching the second fluorescent material 160, another portion proceeds on a different optical path, that is, proceeds by scattering in the first fluorescent material 150 and the second fluorescent material 160. Then, the light-source light 131 passes through the first fluorescent material 150 and the second fluorescent material 160 multiple times and travels along an optical path length longer than the physical distance of a straight path through the first fluorescent material 150 and the second fluorescent material 160. Thereby, the first fluorescent material 150 and the second fluorescent material 160 can efficiently absorb the light-source light 131 and efficiently radiate the first light 151 and the second light 161.

It is possible to obtain the desired color with high efficiency and high luminous flux by appropriately designing the characteristics of the light-source light 131 of the light source 130 and the type, concentration, density, thickness, etc., of the first fluorescent material 150 and the second fluorescent material 160.

Thereby, a light emitting device can be provided to emit light of the desired light-emission color with high efficiency and high luminous flux.

Figure 2:
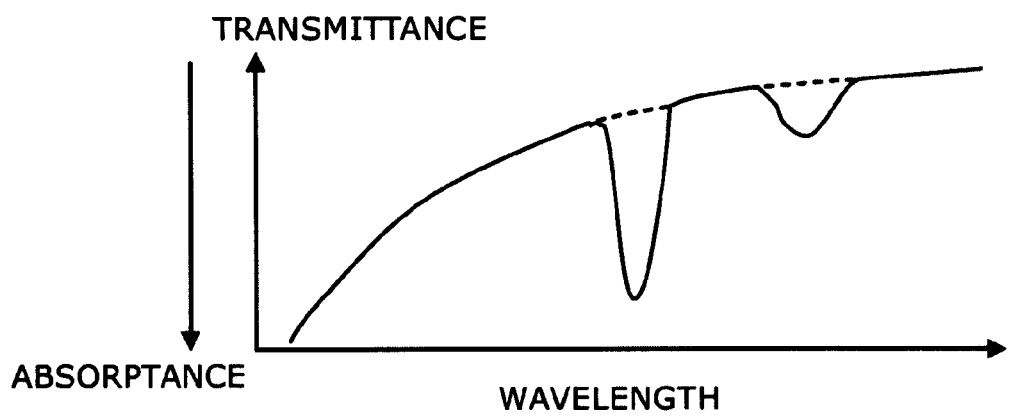
FIG. 2 is a graph illustrating the characteristics of the light emitting device according to the first embodiment of the invention.

FIG. 2 is a graph illustrating the characteristics of the light emitting device according to the first embodiment of the invention.

FIG. 2 is a schematic graph illustrating the relationship between the transmittance and the wavelength of a fluorescent material used in the light emitting device according to the first embodiment of the invention.

In FIG. 2, the wavelength is plotted on the horizontal axis, and the transmittance is plotted on the vertical axis. The transmittance is the inverse of the absorptance, and the vertical axis simultaneously indicates the absorptance.

As illustrated in FIG. 2, generally, the optical transmittance of a substance may be considered to be a characteristic absorption band corresponding to the absorption between energy levels of the substance added to a continuous baseline which is lower for shorter wavelengths and higher for longer wavelengths. In other words, the absorptance of a substance may be considered to be a characteristic absorption band corresponding to the absorption between energy levels of the substance added to a continuous baseline which is higher for shorter wavelengths and lower for longer wavelengths.

Fluorescent materials with high excitation light absorptance have low transmittances at the wavelength of the excitation light, and tend to have low transmittances also at the light emission wavelength. This loss of light results in a decline of the luminous flux of the light emitting device and a decline of the energy efficiency of the light emitting device due to the lost light energy being converted into heat.

Generally, such a loss of light is prominent for excitation light in the short wavelength band, and therefore is prominent more for near-ultraviolet and ultraviolet excitation light than for blue excitation light. In regard to colors of light emitted by fluorescent materials in the visible region, light loss is more prominent for yellow and green light emissions on the short wavelength side than for red and orange light emissions on the long wavelength side. Light loss is very problematic for blue and violet further on the short wavelength side.

Generally, a longer optical path length provides a higher absorptance of light. Therefore, in the case where two or more types of fluorescent materials are combined, the loss of light can be reduced by making the optical path length relatively longer through the fluorescent material having a relatively low absorptance of light.

Accordingly, it is effective to use a structure, such as that of the light emitting device 10 according to this embodiment, in which the second fluorescent material 160 having a high absorptance of light is dispersed in the first fluorescent material 150 having a low absorptance of light.

On the other hand, in the case where a fluorescent material having a low absorptance is dispersed in a layer of a fluorescent material having a high absorptance, the majority of the light produced by the excitation light source is undesirably absorbed by the fluorescent material having the high absorptance. Therefore, sufficient light to cause light emission does not reach the fluorescent material having the low absorptance, resulting in difficulties producing the desired color or obtaining sufficient brightness.

Conversely, in a structure such as that of the light emitting device 10 according to this embodiment in which the second fluorescent material 160 having a high absorptance of light is dispersed in the first fluorescent material 150 having a low absorptance of light, the light-source light 131 from the light source 130 can pass through the first fluorescent material 150 having the low absorptance of light and reach the second fluorescent material 160 having the high absorptance of light. Thereby, the first fluorescent material 150 and the second fluorescent material 160 can radiate the first light 151 and the second light 161, respectively.

Also, the second fluorescent material 160 is multiply dispersed in the first fluorescent material 150 in the light emitting device 10 according to this embodiment. Therefore, the light-source light 131 from the light source 130 passes through the first fluorescent material 150 and the second fluorescent material 160 while being scattered, and the optical path length becomes longer. Therefore, the first light 151 and the second light 161 can be radiated more efficiently.

An LED, for example, may be used as the light source 130 in the light emitting device according to this embodiment. However, the invention is not limited thereto. Various light sources such as those described below may be used.

The light-source light 131 radiated by the light source 130 may be blue light. The first light 151 radiated by the first fluorescent material 150 may be red light. The second light 161 radiated by the second fluorescent material 160 may be yellow light.

As described in regard to FIG. 2, effects of the difference of absorptance between the first fluorescent material 150 and the second fluorescent material 160 increase for shorter wavelengths of light radiated by the light source 130, resulting in better effects of this embodiment. Therefore, the light radiated by the light source 130 may have a wavelength of ultraviolet light.

The color of the light emitted by the light emitting device 10 of this embodiment is the sum of the light-source light 131 from the light source 130, the first light 151 radiated by the first fluorescent material 150, and the second light 161 radiated by the second fluorescent material 160. In such a case, the desired color can be obtained with high efficiency and high luminous flux by appropriately designing the characteristics of the light-source light 131 of the light source 130 and the type, concentration, density, thickness, etc., of the first fluorescent material 150 and the second fluorescent material 160. In particular, an emission of white light can be obtained having various hues including a hint of blue to a hint of red. In other words, the light synthesized from the light-source light 131, the first light 151, and the second light 161 can be considered to be essentially white light. Here, white light includes various hues of light including a hint of blue to a hint of red.

Although the light emitting device 10 according to this embodiment includes the first fluorescent material 150 and the second fluorescent material 160 which radiate light of different wavelengths, the second fluorescent material 160 is dispersed in the first fluorescent material 150, and the first fluorescent material 150 and the second fluorescent material 160 are not provided in multiple layers. Therefore, reflections of light at interfaces between each layer do not occur; the luminous flux does not decline due to light refracting between layers having different refractive indexes; and the manufacturing processes are not complex because it is not necessary to disperse fluorescent materials in a matrix of non-fluorescent materials such as epoxy resin or silicone resin during the formation of multiple layers.

Thus, the light emitting device 10 according to this embodiment provides high luminous flux and is easy to manufacture. The absorptance of the first fluorescent material 150 is lower than the absorptance of the second fluorescent material 160. Therefore, the first fluorescent material 150 can sufficiently transmit the light-source light 131 radiated by the light source 130, and both the first fluorescent material 150 and the second fluorescent material 160 can efficiently contribute to light emission.

A light source that emits light having a wavelength capable of exciting at least a fluorescent material may be used as the light source 130 of the light emitting device 10 according to this embodiment.

The range of the light emission wavelengths of the light source 130 may be appropriately determined according to the wavelength region at which the fluorescent materials to be used are strongly excited, the color and wavelength range of the light to be produced by the light emitting device 10, and the like. For example, the peak light emission wavelength of the light source 130 may be in a range of 240 nm to 480 nm.

For example, to obtain white light, the light emitting device 10 may use a mixture of a light source 130 emitting light having an ultraviolet to violet wavelength and three types of fluorescent materials excited by the light of the light source 130 to produce light-emission colors of blue, green, and red, respectively.

To obtain white light, the light emitting device 10 also may use, for example, a combination of a light source 130 emitting light having a blue wavelength and a fluorescent material excited by the blue light to produce a yellow light emission.

Other various combinations also may be used.

Examples of light sources emitting light of a color usable as the light source 130 such as ultraviolet, near-ultraviolet, violet, bluish-violet, and blue include: a combustible light source having a flame of a usable color; various discharge tubes (for example, using mercury, argon, indium halides, and the like) that emit light of a usable color; various inorganic ELs (for example, using zinc sulfide and the like) that emit light of a usable color; various organic ELs (for example, using fluorene polymers and the like) that emit light of a usable color; a light emitting unit extracting a wavelength region of a usable color from another light source by an optical component such as an optical slit, optical lens, color filter, etc.; a semiconductor light emitting element that emits light of a usable color; and the like.

Considering the energy efficiency of these examples, it is favorable to use a semiconductor light emitting element as the light source 130.

In regard to semiconductor light emitting elements having high energy efficiency, it is favorable to use an LED or laser light emitting element based on a light emitting layer of a III-V group compound semiconductor, particularly $Al_xGa_yIn_{1-x-y}N$, to emit ultraviolet, near-ultraviolet, violet, bluish-violet, or blue light as the light source 130. Specific examples of such elements are discussed in JP 3,182,346 and JP 3,300,657.

On the other hand, the second fluorescent material 160 used in the light emitting device 10 according to this embodiment is a fluorescent material excited by the light-source light 131 radiated by the light source 130, and has no particular limitations in regard to the light emission wavelength or properties. However, the second fluorescent material 160 is dispersed in the first fluorescent material 150 described below, and therefore may be selected considering stability when contacting the first fluorescent material 150 and the like.

The fluorescent materials recited below, for example, may be used as the second fluorescent material 160 when manufacturing a light emitting device that emits white light or visible light by converting ultraviolet, near-ultraviolet, violet, bluish-violet, or blue light-source light 131 emitted by the light source 130.

(1) Metal complex, oxide, condensed oxide, nitride, oxynitride, sulfide, oxysulphide, halide, phosphide, selenide, oxo acid salt (aluminate, silicate, vanadate, borate, phosphate, a portion thereof substituted with a halogen, a salt complex thereof, and the like), or a complex thereof, containing a metal such as Ce, Dy, Gd, Eu, La, Pr, Sm, Tb, Tm, Al, Ba, Bi, Ca, Cd, Ga, Ge, Hg, In, Li, Mg, Na, Sb, Si, Sn, Sr, Tl, Zn, Ag, Cr, Cu, Ir, Mn, Pt, Ta, Ti, V, W, and Y.

(2) A perylene, anthraquinone, lake, azo, quinacridone, anthracene, isoindoline, isoindolinone, phthalocyanine, triphenylmethane, indanthrone, indophenol, cyanine, dioxazine, pyridine-phthalimide condensed derivative, benzoxazol, benzoxazinone, quinazolinone, coumarin, quinophthalone, naphthalimide, styryl, pyrazoline, triazole, or other organic fluorescent pigment, organic dye, or complexes thereof including a hydrocarbon group.

Some specific examples are recited below. Herein, it is sufficient that at least one of the elements separated by commas is included. The light emission wavelength, absorptance, and quantum efficiency can be adjusted by the included element, or by the composition ratio in the case where two or more elements are included. The light emission wavelength, absorptance, and quantum efficiency can be adjusted by the particle size and the surface configuration in the case of a fluorescent material having a particle configuration and by the degree of defects in the case of a crystalline substance.

$(Ba, Eu, Sr)(Mg, Mn)Al_{10}O_{17}$;
$(Ba, Ca, Mg, Sr)_{10}(PO_4)_6Cl_2:Eu$;
$(Ba, Ca, Sr)SiO_4:Eu$;
$(Ba, Ca, Mg, Sr)AlSiN_3:Eu$;
$(Ba, Ca, Sr)_2Si_5N_8:Eu$;
$(Ca, Sr)(Al, Ga)_2S_4:Eu, Tb$;
$(Y, Gd)_3(Al, Ga)_5O_{12}:Ce, Eu, Tb$;
$(Y, La, Gd, Eu)_2(O, S)_3:Eu, Tb$;
$(Y, Gd)BO_3:Ce, Eu$;
$(Zn, Mn)_2SiO_4:Mn$;
$(Mg, Zn, Cd)(O, S, Se)$;
$(Zn, Cd)S:Ag, Cu, Al$;
$(Al, Ga, In)(N, P, As)$;
$BaAl_{12}O_{19}:Mn$;
$BaMg_2Al_{16}O_{27}:Eu$;
$LaPO_4:Ce, Tb$;
$SiAl_2O_2N_2:Eu$;
$Y_2SiO_5:Tb$; and
$YVO_4:Eu$.

Ceramics such as $SiO_2$, $Al_2O_3$, $In_2O_3$, $SnO_2$, $TiO_2$, $ZnO$, $ZrO_2$, $AlN$, or complexes thereof (for example, those represented by the compositional formulas $Al_aSi_bN_cO_d$, $In_xSn_yO_z$, and the like) may be mixed into such fluorescent materials to improve optical reflectance, the excitation light absorptance, uneven color or uneven luminous flux of the emitted light, heat dissipation, etc.

On the other hand, the first fluorescent material 150 used in the light emitting device 10 according to this embodiment holds the dispersed second fluorescent material 160. Therefore, the structure and properties of the first fluorescent material 150 may be adjusted in regard to this aspect.

First, a specific example of a method for incorporating the second fluorescent material 160 in the first fluorescent material 150 will be described.

Methods for incorporating the second fluorescent material 160 in the first fluorescent material 150 include methods that add the second fluorescent material 160 to, for example, a liquid first fluorescent material 150. In such a case, a liquid organic fluorescent dye (a fluorescent material in a liquid state), for example, may be used as the first fluorescent material 150.

Another method includes using a first fluorescent material 150 that is a solid at room temperature, heating to liquefy the first fluorescent material 150, adding the second fluorescent material 160, and then cooling. In such a case, it is favorable that the melting point of the first fluorescent material 150 is lower than the temperature at which the first fluorescent material 150 decomposes. For the first fluorescent material 150, it is favorable to use a fluorescent material that liquefies at not more than 200° C. without decomposing. For example, an organic fluorescent dye or a metal complex having a melting point lower than the decomposition temperature may be used as the first fluorescent material 150. Many fluorescent materials having a hydrocarbon group, such as organic fluorescent dyes and metal complexes having an organic group, have low melting points and high amorphousness and are favorable as the first fluorescent material 150.

In regard to the metal complexes recited above, complexes having a β-diketonate ligand and a phosphine oxide ligand bonded to a rare-earth metal are particularly favorable due to good heat resistance and low melting points or amorphous configurations.

Considering wavelengths and quantum efficiencies of rare-earth metals, Eu is particularly favorable as a red fluorescent material, Tb is particularly favorable as a green fluorescent material, and Tm is particularly favorable as a blue fluorescent material.

Considering heat resistance and quantum efficiencies of the material of the first fluorescent material 150, for Rx and Ry in the general formula of β-diketonate in chemical formula 1, it is favorable to use a tertiary carbon group such as a t-butyl group, 2-methyl-2-pentyl group, 2-phenyl-2-propyl group, or adamantyl group; an aromatic ring group such as a phenyl group, naphtyl group, cyclopentadiene group, pyridyl group, pyrrolyl group, or thienyl group; or an alkyl fluoride group such as a trifluoromethyl group or heptafluoropropyl group.

[Chemical formula 1]

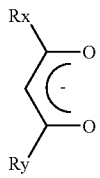

Considering transparency and quantum efficiency of the material of the first fluorescent material 150, for the phosphine oxide ligand of the metal complex recited above, it is favorable to use a chain phosphine oxide represented by the general formula $R_1R_2R_3PO$ (where $R_1$, $R_2$, and $R_3$ are an alkyl group or an aryl group having about one to twenty carbon atoms); a ring phosphine oxide such as 3-methyl-1-phenyl-2-phosphine oxide; a phosphine oxide bonded to a silicone resin; a chain phosphine oxide having multiple PO units in the molecule such as that discussed in JP 3,811,142; a ring phosphine oxide having multiple PO units in the molecule such as that discussed in JP-A 2007-1880 (Kokai); or the like.

Another method may be considered for incorporating the second fluorescent material 160 in the first fluorescent material 150 by using a first fluorescent material 150 made of fluorescent glass, adding the second fluorescent material 160 to the raw material solution of the fluorescent glass, and then vitrifying.

As an example of a specific method, the fluorescent glass can be obtained by adding the second fluorescent material 160 and metal ions which form the light emission centers to the glass material solution; using heating, acid, or alkaline to advance hydrolysis reactions, condensation reactions, and the like; and then favorably performing annealing.

Examples of metal ions forming light emission centers include $Ag^+$, $Al^{3+}$, $Ce^{4+}$, $Cr^{3+}$, $Cu^+$, $Eu^{2+}$, $Eu^{3+}$, $In^{3+}$, $Ir^{3+}$, $Ir^{4+}$, $Mn^{4+}$, $Sn^{4+}$, $Tb^{3+}$, and the like.

These ions may be provided as, for example, an oxide, hydroxide, halide, alkoxide, amide, metal complex, or the like; a salt of an inorganic acid such as, for example, hydrochloride, sulfate, sulfurous acid, nitric acid, carbonic acid, phosphoric acid, boric acid, or silicic acid; or a salt of an organic acid such as formic acid, acetic acid, lactic acid, citric acid, or phthalic acid.

Examples of the main body of the glass material include compounds represented by the general formulas $Al(OR)_3$, $B(OR)_3$, $Si(OR)_4$, $Ti(OR)_4$, and the like (where R is an alkyl group having about one to twenty carbon atoms) as independent compounds, mixtures, or dissolved into a solvent such as water, alcohol, or paraffin with an ion of an element such as Li, Na, K, Mg, Ca, Sr, Ba, B, Al, Si, or Ge. The ions of the elements recited above may be provided as, for example, an oxide, hydroxide, halide, alkoxide, amide, metal complex, or the like; a salt of an inorganic acid such as, for example, hydrochloride, sulfate, sulfurous acid, nitric acid, carbonic acid, phosphoric acid, boric acid, and silicic acid; or a salt of an organic acid such as formic acid, acetic acid, lactic acid, citric acid, or phthalic acid.

An insoluble component such as $Al_2O_3$, $B_2O_3$, $SiO_2$, $TiO_2$, and the like may be mixed into the solution. Additives may be added to the glass material solution recited above to provide stability of the solution and promote the vitrification reaction, including: an inorganic acid such as hydrochloride, sulfate, sulfurous acid, nitric acid, carbonic acid, phosphoric acid, boric acid, silicic acid, and a salt thereof; an organic acid such as formic acid, acetic acid, lactic acid, citric acid, phthalic acid, and a salt thereof; a metal hydroxide; and a salt group such as ammonia, amine, amide, ether, ketone, phosphine, phosphine oxide, and sulfoxide.

Another method for incorporating the second fluorescent material 160 in the first fluorescent material 150 may include using a solid first fluorescent material 150 having openings in the interior and injecting the second fluorescent material 160 therein.

In such a case, an example of a method for injecting may include using a gaseous second fluorescent material 160 and causing the second fluorescent material 160 to contact and adhere to the first fluorescent material 150. Another method for injecting may include using a liquid second fluorescent material 160 and immersing the first fluorescent material 150 therein. Another method for injecting may include using a liquid second fluorescent material 160, using a syringe or the like to inject the second fluorescent material 160 into the first fluorescent material 150, or using a nozzle or the like to spray and adhere the second fluorescent material 160. Another method for injecting may include using a solid second fluorescent material 160, dispersing the second fluorescent material 160 in a liquid such as water, alcohol, or paraffin; then immersing the first fluorescent material 150 therein/injecting the liquid into the first fluorescent material 150 using a syringe or the like/spraying the liquid on the first fluorescent material 150; and then evaporating the liquid. Another method for injecting may include mixing a solid second fluorescent material 160 with the first fluorescent material 150 and then pressing under high pressure. Another method for injecting may include providing a charge or magnetization to the second fluorescent material 160 and causing an effect thereof to move the second fluorescent material 160 into the first fluorescent material 150 by an electric field, magnetic field, etc. However, the invention is not limited thereto, and various methods for inserting objects into openings in another solid may be used.

A third fluorescent material other than the first fluorescent material 150 and the second fluorescent material 160 may be provided in the light emitting device 10 according to this embodiment. In the case where the light emitting device 10 according to this embodiment is used to create a white LED or other device, two types of fluorescent materials may be insufficient to obtain the desired color, color temperature, color rendition, and the like. For example, in the case where white light is to be produced by mixing fluorescent materials corresponding to light of the three primary colors of R, G, and B using an ultraviolet excitation light source, at least three types of fluorescent materials are necessary. Although the first fluorescent material 150 and the second fluorescent material 160 are provided in the light emitting device 10 according to this embodiment, three or more fluorescent materials may be used in such a case.

For example, a mixture of multiple fluorescent materials may perform the role of the second fluorescent material 160. Also, a mixture of multiple fluorescent materials may perform the role of the first fluorescent material 150. In addition to these roles, it may be considered to use, for example, one or more types of fluorescent materials to supplement the color adjustment, the color balance adjustment, etc. Examples of specific materials usable as the third fluorescent material include the materials described as the first fluorescent material 150 and the second fluorescent material 160 described above.

In the light emitting device 10 according to this embodiment, no particular limitations are placed on the third fluorescent material. However, it is favorable that the amount of the third fluorescent material is smaller than the amounts of the first fluorescent material 150 and the second fluorescent material 160. Thereby, the effects of the invention can be provided more easily.

At least one of the first fluorescent material 150 and the second fluorescent material 160 of the light emitting device 10 according to this embodiment may include an additive agent.

It is favorable to form, for example, the first fluorescent material 150 independently in a layer. The processes are simpler than the case where a layer is made having a mixture of other components, and losses of light due to reflection and scattering are low. However, additive agents may be added to the fluorescent material or the fluorescent material may be dispersed in a medium to form a matrix in cases where cracks occur, the surface configuration cannot be formed with good reproducibility, or the property requirements such as the glass transition point, light transmission characteristics, moisture permeability, and elasticity cannot be satisfied for an independent layer.

Examples of the additive agent recited above include: a metal salt such as calcium chloride, ammonium chloride, strontium sulfate, and sodium phosphate; ammonium salt; raw materials of the glass material solution described above; and various surfactants. Specific surfactants include organic fatty acid salt, alkyl sulphate, alkyl polyoxyethylene sulphate, alkylbenzene sulfonate, alkyl phosphate, tetraalkylammonium salt, benzyl-trialkylammonium salt, trialkylamine oxide, betaine, polyether, polyglycoside, fatty acid diethanol amide, alkyl monoglyceryl ether, and the like.

In regard to examples of the medium recited above, inorganic materials include, for example, the raw materials of the glass material solution described above.

Organic materials include thermoplastic resin, thermosetting resin, photo-curable resin, and the like. It is favorable to reduce losses due to light absorption, and therefore resins having low coloration are favorable. These resins specifically include, for example, methacrylic resin such as poly-methyl methacrylate, acrylic resin such as poly-butyl acrylate, styrene resin such as polystyrene, polyester resin such as polycarbonate resin and polyethylene terephthalate, fluorocarbon resin such as polytetrafluoroethylene, vinyl resin such as polyvinyl alcohol and polyvinyl chloride, epoxy resin, cellulosic resin, polyether resin such as polyoxyethylene, polyamide resin such as 6,6-nylon, phenol resin, silicone resin, etc., mixtures thereof, and copolymers thereof. Considering heat resistance and lightfastness with respect to a light source in the ultraviolet to blue region for these mediums, it is favorable to use a medium including a glass material, silicone resin, or the like.

Various methods may be used for mixing the additive and the fluorescent material and dispersing the fluorescent material in the medium recited above. For example, a mixer, high-speed disperser, homogenizer, triple roller, etc., may be used.

The method for making the medium recited above into a matrix may be any appropriate method according to the medium to be used. For example, thermal hydrolysis and the like may be used for glass materials, heating may be used for thermosetting resins, light irradiation may be used for photo-curable resins, and adding moisture and the like may be used for moisture-curable resins. A reaction accelerator, reaction controlling agent, catalyst, etc., may be used as necessary.

The light emitting device 10 according to this embodiment may include various additives. For example, an additive such as a silane coupling agent, light diffusing agent, or filler may be included to improve the adhesion of layers including the first fluorescent material 150 or scatter light to a wide area.

To ensure the long-term reliability of the light emitting device 10 according to this embodiment, the light emitting device 10 according to this embodiment may include an additive such as an antioxidant, processing stabilizing agent, oxidation stabilizing agent, heating stabilizing agent, ultraviolet absorber, or silane coupling agent.

Although these additives may be used both inside and outside the light emitting layer, it is favorable to reduce the contact of the additives with the fluorescent materials to prevent the decline of the efficiency of the fluorescent materials. It is favorable that an ultraviolet absorber does not exist between the light source 130 and the fluorescent materials to prevent losses due to absorption of light. It is favorable for all additive agents to have low absorption of the light emitted by the fluorescent materials.

In the light emitting device 10 according to this embodiment, the method for disposing the first fluorescent material 150 and the second fluorescent material 160 in the package 110 in which the light source 130 is disposed is arbitrary. In the case where these fluorescent materials are disposed independently or disposed in a matrix including the fluorescent materials, various disposition methods such as dropping, coating, casting, and bonding by a binder may be appropriately selected. These fluorescent materials may be disposed by multiple subdivided steps to provide nonuniformity to the concentration and components thereof. Heating and/or cooling may be performed to make uniform, soften, or harden the fluorescent materials.

Figure 3:
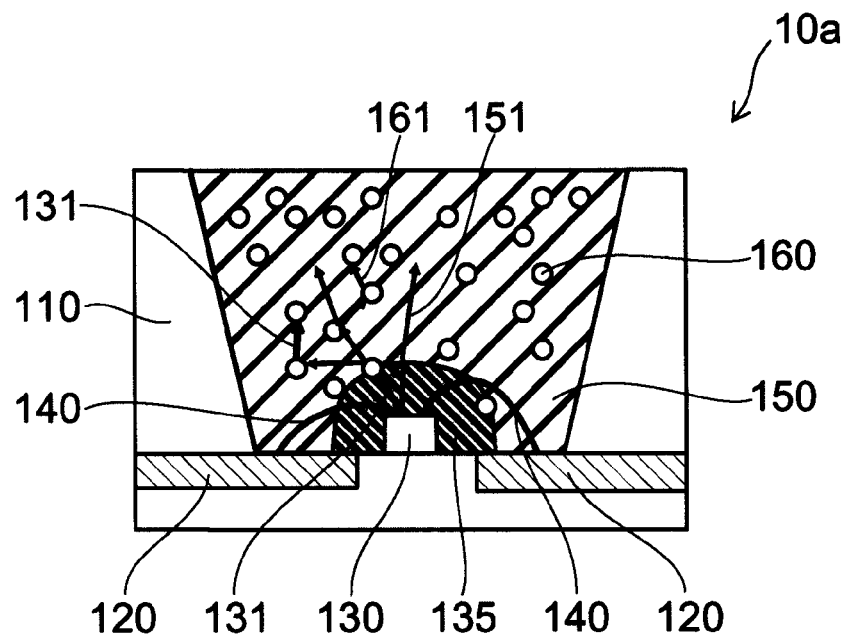
FIG. 3 is a schematic cross-sectional view illustrating the configuration of another light emitting device according to the first embodiment of the invention.

FIG. 3 is a schematic cross-sectional view illustrating the configuration of another light emitting device according to the first embodiment of the invention.

In the light emitting device 10a according to the first embodiment of the invention illustrated in FIG. 3, a light transmitting layer 135 is provided between the light source 130 and the first and second fluorescent materials 150 and 160.

A component such as that discussed in, for example, JP-A 2007-273562 (Kokai) may be used as the light transmitting layer 135. A material which does not include a fluorescent material may be used as the light transmitting layer 135.

Due to the light transmitting layer 135, the first fluorescent material 150 and the second fluorescent material 160 do not directly contact the light source 130. Therefore, effects are provided such as inhibiting deterioration of the first and second fluorescent materials 150 and 160 due to heat and light produced by the light source 130.

Using a light transmitting layer 135 having a lens configuration or provided with a fine recession/protrusion structure can provide the effect of increasing the extraction efficiency of light from the light source 130. It is favorable that the light transmitting layer 135 absorbs almost no light from the light source 130 and does not deteriorate due to light from the light source 130. Specifically, a light-transmitting glass material or silicone resin may be used as the light transmitting layer 135.

The configuration of the package 110 used in the light emitting devices 10 and 10a recited above according to this embodiment is arbitrary. For example, the package 110 may have a box-like configuration which contains the fluorescent materials (the first fluorescent material 150 and the second fluorescent material 160). Also, the package 110 may have a flat-plate configuration upon which the fluorescent materials (the first fluorescent material 150 and the second fluorescent material 160) are affixed.

The configuration of the light source 130 disposed in the package 110 and the method for disposing are arbitrary. Bonding by a bonding agent, fixing by a fixation jig, and other various methods may be used. The light source 130 may be formed as one with the package 110.

The light source 130 of the light emitting device 10 according to this embodiment may be connected to an electronic circuit provided on the exterior of the light emitting device 10 to switch the light emission ON/OFF and adjust the amount of light emission.

The light source 130 of the light emitting device 10 illustrated in FIG. 1 has electrodes on an upper face and a lower face thereof. The electrode of the lower face of the light source 130 is bonded to one electrode unit 120 of the package 110 via a conductive bonding layer. On the other hand, the electrode of the upper face of the light source 130 is electrically connected to another electrode unit 120 provided on one end of the package 110 by wiring 140 such as a wire.

Figure 4:
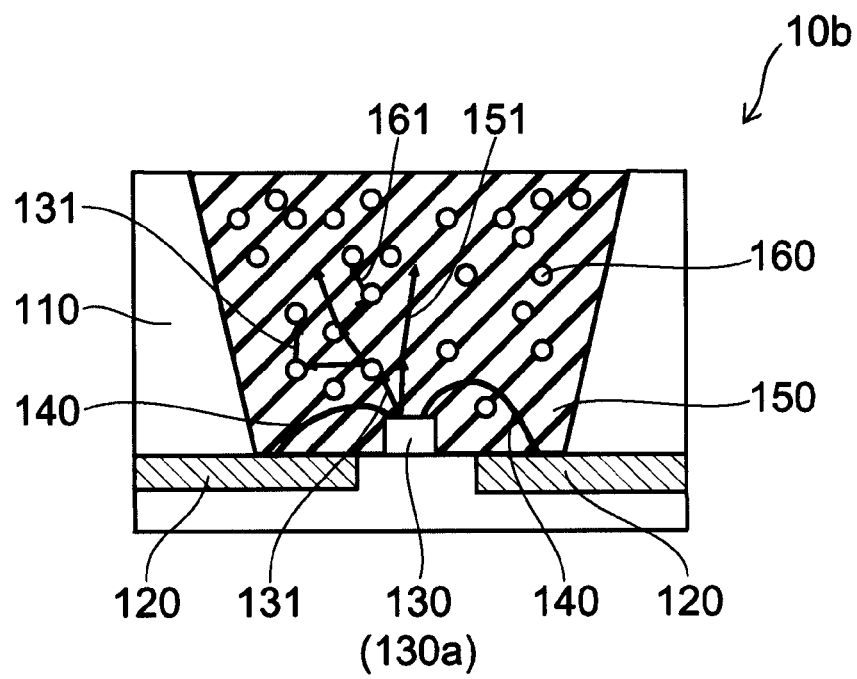
FIG. 4 is a schematic cross-sectional view illustrating the configuration of another light emitting device according to the first embodiment of the invention.

FIG. 4 is a schematic cross-sectional view illustrating the configuration of another light emitting device according to the first embodiment of the invention.

In the light emitting device 10b according to this embodiment illustrated in FIG. 4, a semiconductor light emitting element 130a having two main electrodes on the upper face is used as the light source 130. Otherwise, the light emitting device 10b is similar to the light emitting device 10, and a description is omitted.

Thus, in the case where the semiconductor light emitting element 130a having two main electrodes on the upper face is used as the light source 130, the light source 130 can be bonded to the package 110 via a not-illustrated insulative bonding layer provided on the lower face of the light source 130. The two electrodes of the upper face can be electrically connected to the respective electrode units 120 of the package 110 by the wiring 140 such as wires.

Thus, the light source 130 can be connected to the electronic circuit by various methods to perform the desired operations.

Second Embodiment

Figure 5:
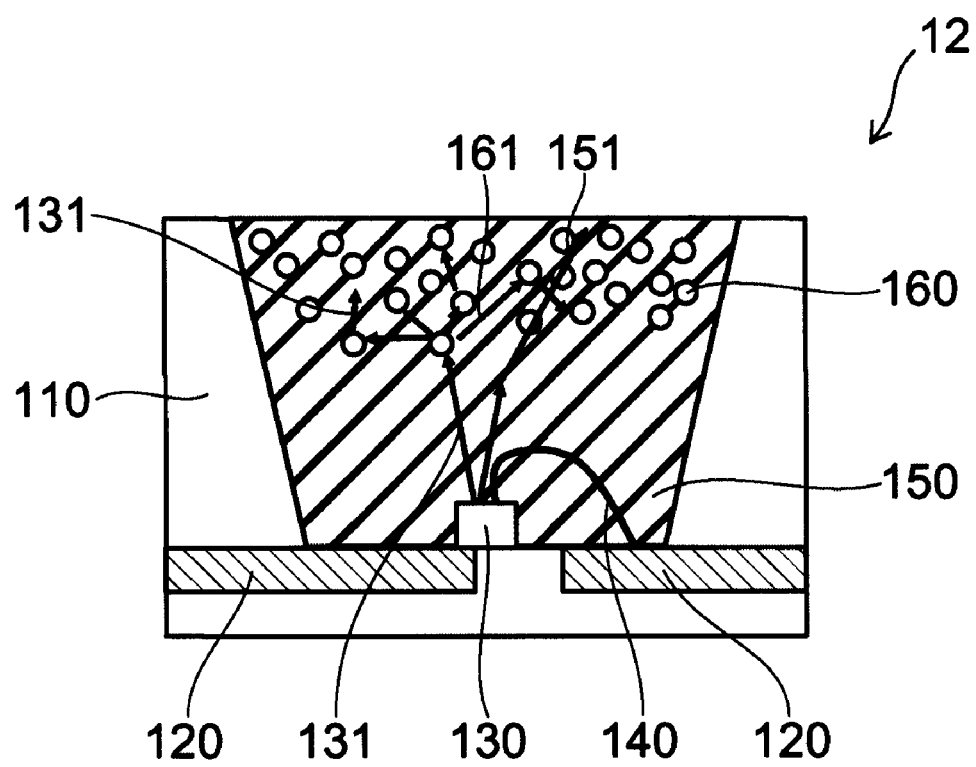
FIG. 5 is a schematic cross-sectional view illustrating the configuration of a light emitting device according to a second embodiment of the invention.

FIG. 5 is a schematic cross-sectional view illustrating the configuration of a light emitting device according to a second embodiment of the invention.

In the light emitting device 12 according to the second embodiment of the invention illustrated in FIG. 5, the concentration of the second fluorescent material (the second wavelength conversion unit) 160 in the first fluorescent material (the first wavelength conversion unit) 150 is higher on the side distal to the light source 130 than on the side proximal thereto. Otherwise, the light emitting device 12 may be similar to the light emitting device 10 according to the first embodiment, and a description is omitted.

In other words, the second fluorescent material 160 is disposed at a position in the interior of the first fluorescent material 150 distal to the light source 130. In the case where the concentration of the second fluorescent material 160, which has a high absorptance, is high proximal to the light source 130, light from the light source 130 does not sufficiently reach the first fluorescent material 150, and the light emission efficiency declines. However, by increasing the concentration of the second fluorescent material 160 in the first fluorescent material 150 on the side distal to the light source 130 as in the light emitting device 12 according to this embodiment, light from the light source 130 can irradiate sufficiently on the first fluorescent material 150, and the light emission efficiency is higher.

Thus, the light emitting device 12 according to this embodiment can emit light having the desired light-emission color with even higher efficiency and luminous flux.

The following methods for disposing the first fluorescent material 150 and the second fluorescent material 160 may be used to provide such a distribution of the concentration of the second fluorescent material 160 in the first fluorescent material 150.

For example, a method may be used in which a process disperses and incorporates the second fluorescent material 160 in the first fluorescent material 150 to fabricate multiple portions having different concentrations of the second fluorescent material 160. Then, these portions are sequentially disposed from proximal to distal with respect to the light source 130 such that the concentration of the second fluorescent material 160 goes from low to high. The methods for disposing the fluorescent materials described above may be used appropriately as this disposition method. Such a method can easily and accurately control the concentration and amounts of the second fluorescent material 160 and the first fluorescent material 150, and is a favorable method in the case where the concentration is changed over several levels.

In the case of manufacturing by such a method, interfaces may be formed between layers of sequentially disposed fluorescent materials, resulting in losses of light emission due to reflections of light at the interfaces. In such a case, a thermoplastic substance may be used as the first fluorescent material 150. After disposing the fluorescent material layers, all or a portion of the fluorescent material layers may be heated to remove the interfaces, and the luminous flux of the light emitting device can be improved. For example, such a property of the complex including a rare-earth metal and the like described above may be utilized.

Another method for providing a distribution to the concentration of the second fluorescent material 160 in the first fluorescent material 150 may include, for example, using a process that disperses and incorporates the second fluorescent material 160 in the first fluorescent material 150 to fabricate a configuration in which the first fluorescent material 150 has a changing concentration of the second fluorescent material 160 in the interior thereof. Then, the resulting configuration is disposed in the package 110 in which the light source 130 is disposed.

Here, methods for providing a changing concentration of the second fluorescent material 160 by location in the first fluorescent material 150 may use methods for incorporating the second fluorescent material 160 in the first fluorescent material 150 such as adding, injecting, immersing, and spraying.

As a specific example in the case where a solid second fluorescent material 160 is injected under pressure by an injector into a first fluorescent material 150 having a gel form, the injection may be performed while changing, level-wise or continuously by location in the first fluorescent material 150, the injection pressure, the injection time, and the injection rate. Thereby, the concentration of the injected second fluorescent material 160 can be changed level-wise or continuously.

According to the incorporating method, the concentration may be changed as necessary using appropriate parameters such as immersion depth and immersion time, spraying concentration and spraying time, strength of the electric field and magnetic field for methods utilizing the same, etc.

Such a method is favorable in that manufacturing is possible without greatly increasing the number of processes, even in cases where the concentration is to be continuously changed or the concentration is to be changed by level.

It is also possible to perform the dispersing and incorporating recited above on a light source 130 already disposed in the package 110. For example, the package 110, in which the light source 130 is disposed, may contain, in advance, the first fluorescent material 150. Then, the second fluorescent material 160 is dispersed and incorporated by a method such as adding, injecting, immersing, or spraying.

Figure 6A:
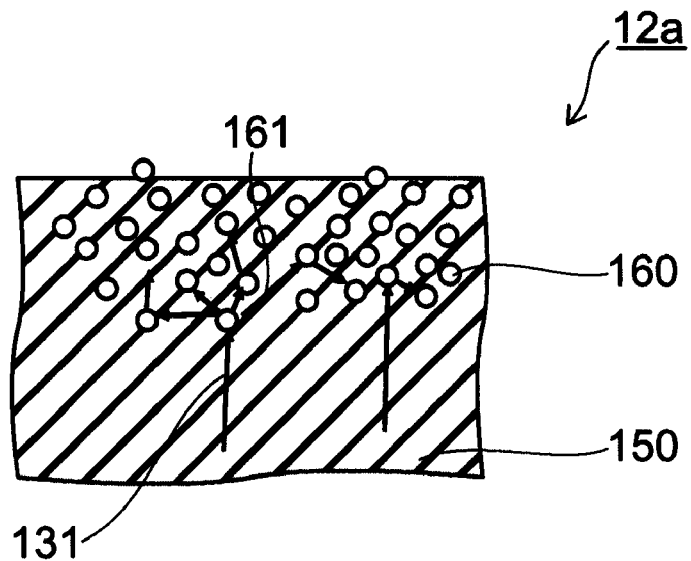
FIGS. 6A and 6B are schematic cross-sectional views illustrating configurations of the light emitting device according to the second embodiment of the invention.
Figure 6B:
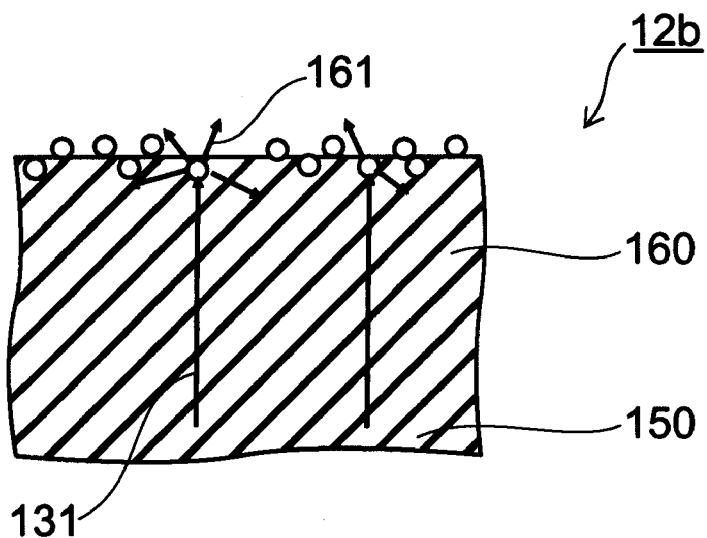

FIGS. 6A and 6B are schematic cross-sectional views illustrating configurations of the light emitting device according to the second embodiment of the invention.

In other words, FIGS. 6A and 6B illustrate two types of light emitting devices 12a and 12b according to this embodiment. Only the portions of the first fluorescent material 150 and the second fluorescent material 160 are illustrated.

In the light emitting device 12a according to this embodiment illustrated in FIG. 6A, the second fluorescent material 160 is disposed such that the concentration of the second fluorescent material 160 in the first fluorescent material 150 increases on the side distal to the light source 130. In such a case, most of the second fluorescent material 160 is not exposed at the surface of the first fluorescent material 150.

On the other hand, in the light emitting device 12b according to this embodiment illustrated in FIG. 6B, the concentration of the second fluorescent material 160 in the first fluorescent material 150 is high on the side distal to the light source 130. Most of the second fluorescent material 160 is exposed at the surface of the first fluorescent material 150.

In the case where most of the second fluorescent material 160 is not exposed at the surface of the first fluorescent material 150 as in the light emitting device 12a, although a portion of the light-source light 131 is absorbed by the first fluorescent material 150 and the second fluorescent material 160, unabsorbed light remains. The second fluorescent material 160 is dispersed in the first fluorescent material 150, and therefore the remaining light is scattered, the optical path essentially lengthens, and the remaining light is effectively and efficiently absorbed by the first fluorescent material 150 and the second fluorescent material 160.

Conversely, in the case where most of the second fluorescent material 160 is exposed at the surface of the first fluorescent material 150 as in the light emitting device 12b illustrated in FIG. 6B, the light-source light 131 that is not absorbed by the first fluorescent material 150 and the second fluorescent material 160 is scattered by the second fluorescent material 160; and a portion thereof once again travels in the direction of the layers of the first fluorescent material 150 and the second fluorescent material 160 and is absorbed by the first fluorescent material 150 and the second fluorescent material 160. However, almost all of the light travels in a direction opposite to the direction toward the first fluorescent material 150 and the second fluorescent material 160 after being scattered, and scattering effects may not be utilized.

Accordingly, it is favorable to make more efficient and practical use of the scattering effects as in the light emitting device 12a illustrated in FIG. 6A and the light emitting device 12 illustrated in FIG. 5 in which a portion of the first fluorescent material 150 is disposed on the side farther to the light source than the second fluorescent material 160.

However, the invention is not limited thereto. In other words, the first fluorescent material 150 may not be disposed on the side of the second fluorescent material 160 distal to the light source for most of the second fluorescent material 160 to expose most of the second fluorescent material 160 from the first fluorescent material 150 as in the light emitting device 12b illustrated in FIG. 6B depending on characteristics, concentrations, etc., of the light source 130, the first fluorescent material 150, and the second fluorescent material 160.

The semiconductor light emitting element 130a, which has two main electrodes on the upper face as illustrated in FIG. 4, may be used as the light source 130 also in the light emitting device 12 according to this embodiment.

Third Embodiment

Figure 7:
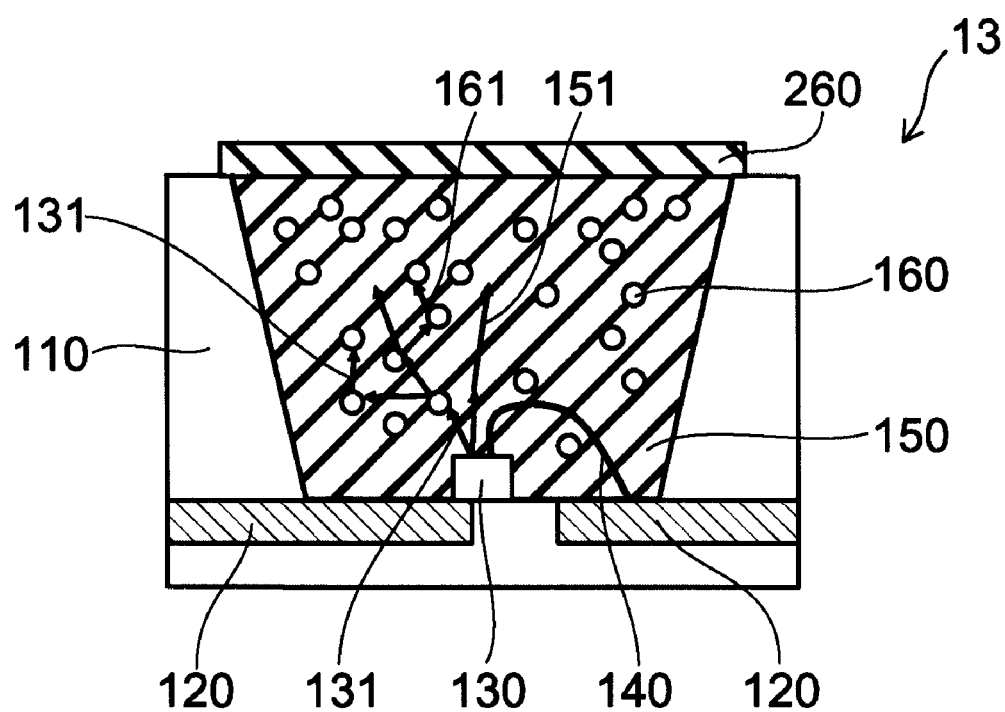
FIG. 7 is a schematic cross-sectional view illustrating the configuration of a light emitting device according to a third embodiment of the invention.

FIG. 7 is a schematic cross-sectional view illustrating the configuration of a light emitting device according to a third embodiment of the invention.

The light emitting device 13 according to the third embodiment of the invention illustrated in FIG. 7 further includes a moisture resisting cover 260 provided on the side of the first fluorescent material 150 opposite to the light source 130 to protect at least one of the first fluorescent material 150 and the second fluorescent material 160 against moisture.

In other words, the light emitting device 13 of this specific example is the light emitting device 10 described in the first embodiment having the moisture resisting cover 260 further provided thereon. Otherwise, the light emitting device 13 may be similar to the light emitting device 10 described in the first embodiment, and a description is omitted. Additionally, the moisture resisting cover 260 may be provided on the light emitting device 10a according to the first embodiment and the light emitting devices 12, 12a, and 12b described in the second embodiment.

Thus, by providing the moisture resisting cover 260, at least one of the first fluorescent material 150 and the second fluorescent material 160 is protected against moisture; the deterioration of at least one of the first fluorescent material 150 and the second fluorescent material 160 is prevented; and the reliability of the light emitting device improves. Also, a wider range of materials may be selected for the at least one of the first fluorescent material 150 and the second fluorescent material 160, and the light emission characteristics and electrical characteristics of the light emitting device can be improved.

Thus, the light emitting device 13 according to this embodiment has high reliability, high light emission characteristics, and high electrical characteristics, and emits light having the desired light-emission color with high efficiency and high luminous flux.

Generally, in the case where a fluorescent material having a hydrocarbon group is used as at least one of the first fluorescent material 150 and the second fluorescent material 160, there is a greater risk of deterioration due to moisture than for an oxide fluorescent material. Therefore, it is effective to provide a moisture resisting cover 260 which protects against moisture to prevent effects of external moisture on at least one of the first fluorescent material 150 and the second fluorescent material 160.

To protect a fluorescent material (at least one of the first fluorescent material 150 and the second fluorescent material 160), the moisture resisting cover 260 exists in the optical path of the light emitted by the fluorescent material (the at least one of the first fluorescent material 150 and the second fluorescent material 160). Therefore, an essentially transparent material (having the ability to transmit light) may be used as the moisture resisting cover 260.

Although it is favorable that the moisture resisting cover 260 does not absorb across all wavelengths of the colors of the light emitted by the light emitting device, design is possible in practical use to control the colors of light emitted by the fluorescent materials (the first fluorescent material 150 and the second fluorescent material 160) according to the wavelengths and degree of absorption due to the moisture resisting cover 260 such that the light passing through the moisture resisting cover 260 has the desired color.

Materials which are transparent and protective against moisture as recited above may be used as the moisture resisting cover 260. Inorganic materials include, for example, quartz glass, other transparent or semi-transparent glasses, transparent minerals including Al, Si, O, and the like, and transparent films including at least one of $SnO_2$ and $TiO_2$.

Organic materials which can be used as the moisture resisting cover 260 include methacrylic resin such as poly-methyl methacrylate, acrylic resin such as poly-butyl acrylate, styrene resin such as polystyrene, polyester resin such as polycarbonate resin and polyethylene terephthalate, fluorocarbon resin such as polytetrafluoroethylene, vinyl resin such as polyvinyl alcohol and polyvinyl chloride, epoxy resin, cellulosic resin, polyether resin such as polyoxyethylene, polyamide resin such as 6,6-nylon, phenol resin, silicone resin, etc., mixtures thereof, and copolymers thereof.

As illustrated in FIG. 7, the moisture resisting cover 260 may be provided to contact the first fluorescent material 150 (and the second fluorescent material 160) on the side of the first fluorescent material 150 (and the second fluorescent material 160) opposite the light source 130.

Figure 8A:
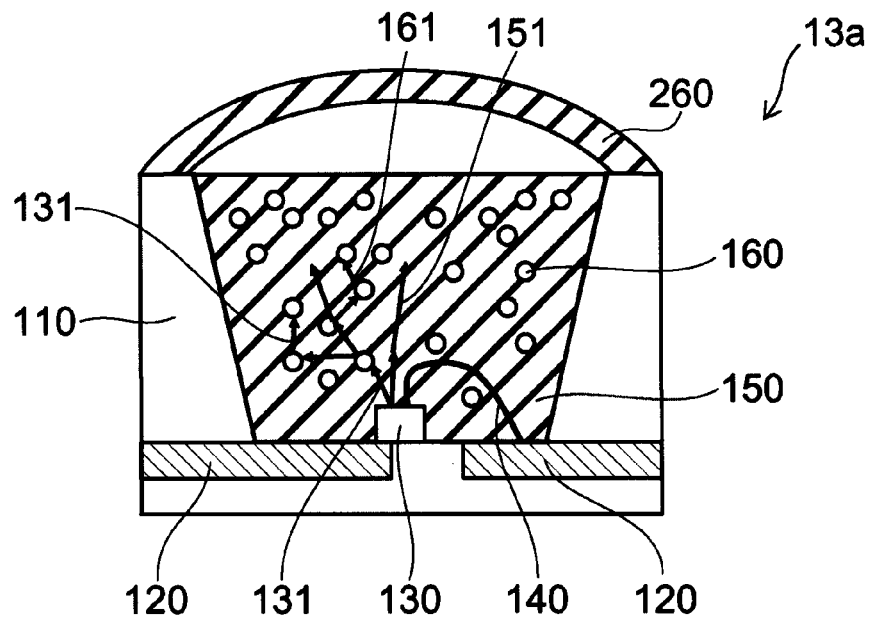
FIGS. 8A and 8B are schematic cross-sectional views illustrating configurations of another light emitting device according to the third embodiment of the invention.
Figure 8B:
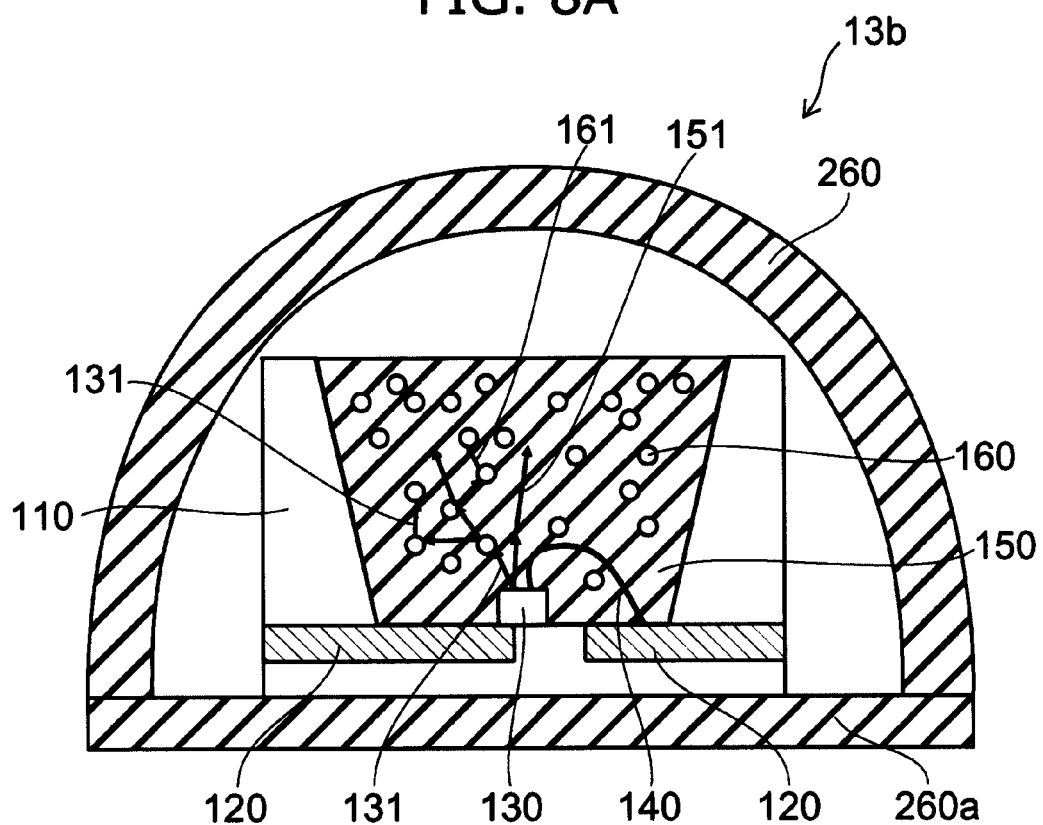

FIGS. 8A and 8B are schematic cross-sectional views illustrating configurations of another light emitting device according to the third embodiment of the invention.

In the light emitting device 13a according to this embodiment illustrated in FIG. 8A, the moisture resisting cover 260 is provided separate from the first fluorescent material 150 (and the second fluorescent material 160) on the side of the first fluorescent material 150 (and the second fluorescent material 160) opposite the light source 130. In such a case, the moisture resisting cover 260 has a curved protruding configuration and is configured such that the first fluorescent material 150 (and the second fluorescent material 160) are covered by the recess of the inside of the curved protruding configuration. In such a case, the moisture resisting cover 260 may be provided to contact an upper face of the package 110.

In the light emitting device 13a, the inside of the curved protruding configuration of the moisture resisting cover 260 may be configured to directly contact the first fluorescent material 150 (and the second fluorescent material 160).

Thus, the moisture resisting cover 260 may be provided to contact the first fluorescent material 150 (and the second fluorescent material 160), and may be provided separate from the first fluorescent material 150 (and the second fluorescent material 160).

In the light emitting device 13b according to this embodiment illustrated in FIG. 8B, the moisture resisting cover 260 is provided to surround the package 110. In other words, a lower-portion moisture resistant body 260a and a moisture resisting cover 260 provided thereabove are moisture-resistant and surround the package 110 in which the light source 130, the first fluorescent material 150, and the second fluorescent material 160 are provided.

Also in this case, the moisture resisting cover 260 may be provided separate from or contacting the first fluorescent material 150 (and the second fluorescent material 160) on the side of the first fluorescent material 150 (and the second fluorescent material 160) opposite the light source 130.

The moisture resisting cover 260 may be provided also to surround at least a portion of an electronic circuit accompanying the light emitting device. In other words, the moisture resisting cover 260 may be provided on the side of the first fluorescent material 150 (and the second fluorescent material 160) opposite the light source 130 in a light emitting apparatus described below, which uses a light emitting device according to an embodiment of the invention. In such a case, the moisture resisting cover 260 may be provided to surround at least a portion of the electronic circuit and the like of the light emitting apparatus.

Methods for disposing the moisture resisting cover 260 are arbitrary.

For example, in the case where the moisture resisting cover 260 is disposed to contact a fluorescent material (at least one of the first fluorescent material 150 and the second fluorescent material 160), the material forming the moisture resisting cover 260 may be disposed by spraying, coating, compression bonding, etc., onto a layer made of the first fluorescent material 150 in which the second fluorescent material 160 is dispersed.

In such a case, the material may be dissolved in a solvent or dispersed in a dispersant, or a binding component may be added as necessary. It is desirable that such a solvent, dispersant, or binding component does not include a component in which the first fluorescent material 150 (and/or the second fluorescent material 160) does not dissolve within the processing time or by which the first fluorescent material 150 (and the second fluorescent material 160) lose light emission characteristics. In particular, in the case where a fluorescent material including hydrocarbon is used as the first fluorescent material 150, it is possible that a versatile organic solvent may dissolve such a fluorescent material. Therefore, it is favorable to use a water- or fluorine-based solvent or dispersant.

Generally, sulfur compounds, peroxides, and the like are components likely to cause fluorescent materials to lose light emission characteristics. Therefore, it is not favorable to use solvents, dispersants, or binding components including sulfur compounds, peroxides, and the like.

It is favorable that the binding component used in the material forming the moisture resisting cover 260 is highly transparent and highly adherent to the fluorescent material layer. For example, various acrylic or silicone adhesives may be used.

On the other hand, in the case where the moisture resisting cover 260 is separated from the first fluorescent material 150 (and the second fluorescent material 160) and placed, for example, a moisture resisting cover 260 separately molded from a transparent plate or having a lens configuration, etc., is mounted on an appropriate position of the light emitting device. Mounting methods in such a case include compression bonding, affixing, using threaded bolts, inserting, etc. The moisture resisting cover 260 may be formed as one with the package 110 of the light emitting device and various substrates and members accompanying the light emitting device. In other words, the moisture resisting cover recited above may be mounted at a position appropriate for the light emitting apparatus described below using a light emitting device according to this embodiment.

In the case where the moisture resisting cover 260 is separated from the light source 130 and placed such that the intensities of the ultraviolet rays, short wavelengths, and the like of the light-source light 131 radiated by the light source 130 are sufficiently low, it is not necessary for the moisture resisting cover 260 to have lightfastness with respect to such light-source light 131. Therefore, an inexpensive and versatile transparent resin such as methacrylic resin or styrene resin may be used as the moisture resisting cover 260.

Examples and comparative examples of the light emitting device according to embodiments of the invention will now be described.

Light emitting devices according to a first example to an eighth example illustrate light emitting devices emitting white light using a combination of an element emitting blue light and fluorescent materials. Light emitting devices according to a ninth example to a twelfth example are devices emitting white light using a combination of an element emitting near-ultraviolet to bluish-violet light and fluorescent materials.

Colors of white are established, for example, as the five types of day light, natural light, white, warm white, and lamp by the specification for lamps for illumination according to Japanese Industrial Standards JIS Z9112. Each corresponding color temperature range is established. Although examples illustrated hereinbelow use a color of natural light having a color temperature of 5,000 K and a color of lamp having a color temperature of 3,000 K for convenience of comparison, the invention is not limited thereto. Light emitting devices having a high luminous flux for other colors also may be obtained by appropriately selecting characteristics of the light source 130, the type of the fluorescent material (at least one of the first fluorescent material 150 and the second fluorescent material 160), the compounding ratio of the fluorescent materials, etc.

First Example

In a light emitting device 51 according to a first example of the invention, a light emitting element emitting blue light, namely, a GaN semiconductor light emitting element emitting light around 410 to 500 nm having a peak wavelength of 450 nm is used as the light source 130. A granular fluorescent material of $(Ba, Ca, Sr)_2SiO_4$:Eu emitting yellow light is used as the second fluorescent material 160. A Eu (III) complex emitting red light and represented by chemical formula 2 is used as the first fluorescent material 150.

[Chemical formula 2]

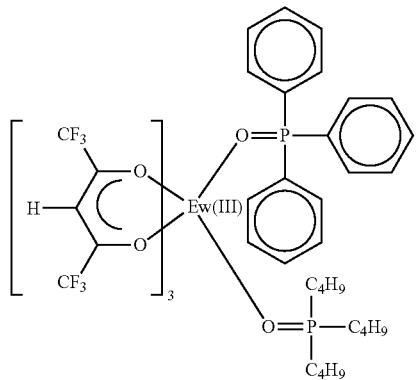

The materials recited above forming the first fluorescent material 150 and the second fluorescent material 160 are disposed and fixed between quartz plates such that the material thickness is 0.2 mm. The absorptance is measured using an ultraviolet/visible spectrometer. The absorptance at a wavelength of 450 nm is 95% for the material forming the second fluorescent material 160 and 40% for the material forming the first fluorescent material 150.

Then, one part by weight of the material forming the second fluorescent material 160 and ten parts by weight of the material forming the first fluorescent material 150 are uniformly mixed in a mortar. The mixture is heated until the material forming the first fluorescent material 150 melted, and then the mixture is cooled. Thereby, a fluorescent substance A is fabricated in which the granular second fluorescent material 160 is dispersed and incorporated in the mass of the transparent first fluorescent material 150.

Then, the fluorescent substance A is disposed in a package 110 in which a light source 130 is provided as illustrated in FIG. 1, and the light emitting device 51 according to this example is fabricated.

Lead wires connected to a direct-current power source are brought into contact with each of the positive and the negative terminals of the light source 130 of the light emitting device 51. A prescribed current is provided to cause the light emitting device 51 to emit light, and the color and the luminous flux of the light from the light emitting device 51 are measured. The color of the light is lamp with a color temperature of about 3,000 K and a luminous flux of 2.8 lm.

First Comparative Example

A 1:10 mixture of the material forming the second fluorescent material 160 and the material forming the first fluorescent material 150 used in the first example is disposed in a package 110 similar to that used in the first example. In other words, a light emitting device of a first comparative example is made of only a mixture of the material forming the second fluorescent material 160 and the material forming the first fluorescent material 150, and heating is not performed. Therefore, a powder mixture of the material forming the first fluorescent material and the material forming the second fluorescent material is used in the light emitting device of the first comparative example, and the second fluorescent material is not dispersed and incorporated in the first fluorescent material.

The light emitting device of the first comparative example having such a configuration is similarly caused to emit light, and the color and the luminous flux of the light from the light emitting device are measured. The same color as that of the first example could not be produced in the case where the same weights of fluorescent materials as those of the first example are used. The weight of the fluorescent materials and the mixing ratio of the fluorescent materials disposed in the package are adjusted to produce light having a color of lamp and a color temperature of about 3,000 K. The resulting luminous flux is 1.5 lm.

In the light emitting device 51 according to the first example, the light emitting layer which performed wavelength conversion on the light-source light 131 from the light source 130 to emit light is a transparent monolayer structure in which the second fluorescent material 160 is dispersed and incorporated in the first fluorescent material 150. Conversely, in the light emitting device of the first comparative example, the light emitting layer is a powder mixture of the material forming the second fluorescent material 160 and the material forming the first fluorescent material 150, and the light emitting device 51 according to the first example has a luminous flux higher than that of the light emitting device of the first comparative example.

The light emitting layers of the following examples and comparative examples are disposed to match color temperatures for easier comparison of luminous flux. Different dispersing methods and different disposition methods result in different amounts of light absorption and light emission for each fluorescent material. Therefore, the colors produced using the same weights of the fluorescent materials are different, and the color temperatures could not be matched. Therefore, the luminous fluxes described herein are for cases where the weights of the fluorescent materials are adjusted to produce about the prescribed color temperature. Further, in the case where changing the weights is insufficient to match colors, it is necessary to also adjust the mixing ratio of the first fluorescent material and the second fluorescent material. The examples for such cases are indicated.

Second Example

Similarly to the first comparative example, a 1:10 mixture of the material forming the second fluorescent material 160 and the material forming the first fluorescent material 150 is disposed in the package 110. Then, the entire package 110 is heated to melt the material forming the first fluorescent material 150 and disperse and incorporate the granular second fluorescent material 160 in the transparent first fluorescent material 150. Cooling is then performed, and a light emitting device 52 according to a second example is fabricated.

The light emitting device 52 is caused to emit light, and the color and the luminous flux of the light from the light emitting device 52 are measured. Light having a color of lamp, a color temperature of about 3,000 K, and a luminous flux of 3.1 lm is obtained.

Third Example

Figure 9:
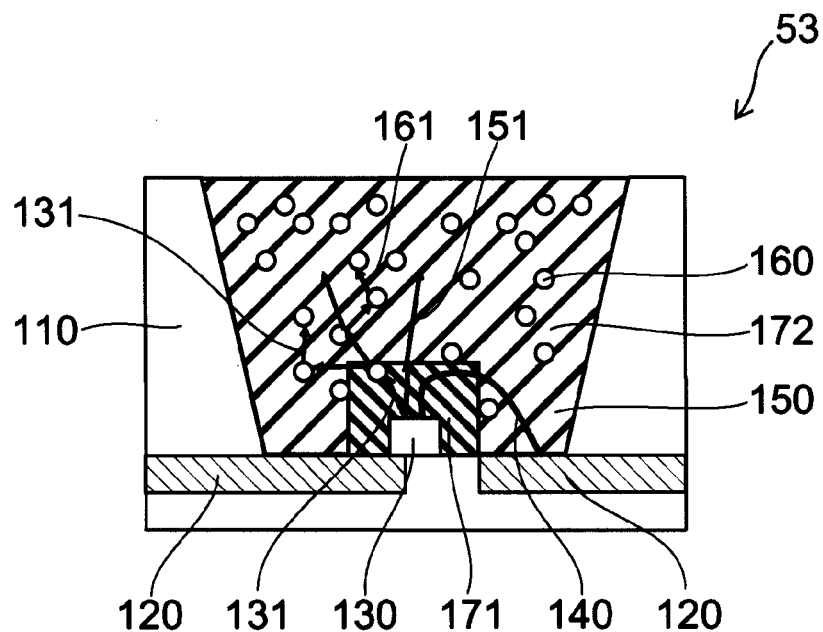
FIG. 9 is a schematic cross-sectional view illustrating the configuration of a light emitting device according to a third example of the invention.

FIG. 9 is a schematic cross-sectional view illustrating the configuration of a light emitting device according to a third example of the invention.

In the light emitting device 53 according to the third example of the invention illustrated in FIG. 9, the concentration of the second fluorescent material 160 in the first fluorescent material 150 is different between a region 171 proximal to the light source 130 and a region 172 more distal to the light source 130 than the region 171.

In other words, a fluorescent substance B having a low concentration of the second fluorescent material 160 in the first fluorescent material 150 is disposed in the region 171 proximal to the light source, and a fluorescent substance C having a high concentration of the second fluorescent material 160 in the first fluorescent material 150 is disposed in the region 172 distal to the light source.

In other words, using the mixing, the melting, and the cooling described in the first example, the fluorescent substance B is fabricated by dispersing and incorporating the second fluorescent material 160 in the first fluorescent material 150 with a weight ratio of the material forming the second fluorescent material 160 to the material forming the first fluorescent material 150 of 1:100; and the fluorescent substance C is fabricated by dispersing and incorporating the second fluorescent material 160 in the first fluorescent material 150 with a weight ratio of the material forming the second fluorescent material 160 to the material forming the first fluorescent material 150 of 1:1.

Then, the light emitting device 53 according to this example is fabricated by disposing the fluorescent substance B in the region 171 proximal to the light source and the fluorescent substance C in the region 172 distal to the light source in a package 110 similar to that used in the first example. The light emitting device 53 is caused to emit light, and the color and the luminous flux of the light from the light emitting device 53 are measured. Light having a color of lamp, a color temperature of about 3,000 K, and a luminous flux of 3.3 lm is obtained.

Fourth Example

In a light emitting device 54 according to a fourth example of the invention, the fluorescent substance C described in the light emitting device according to the third example is disposed in the region 171 proximal to the light source, and the fluorescent substance B is disposed in the region 172 distal to the light source. In other words, the fluorescent substance B and the fluorescent substance C of the light emitting device 54 according to the fourth example are positionally reversed with respect to those of the light emitting device 53 according to the third example.

The light emitting device 54 according to this example is caused to emit light, and the color and the luminous flux of the light from the light emitting device 54 are measured. Light having a color of lamp, a color temperature of about 3,000 K, and a luminous flux of 2.2 lm is obtained.

Comparing the light emitting device 53 according to the third example and the light emitting device 54 according to the fourth example, a higher luminous flux is obtained for the light emitting device 53 in which the second fluorescent material 160 having a high absorptance is disposed at a low concentration in the region 171 proximal to the light source 130.

Fifth Example

Figure 10:
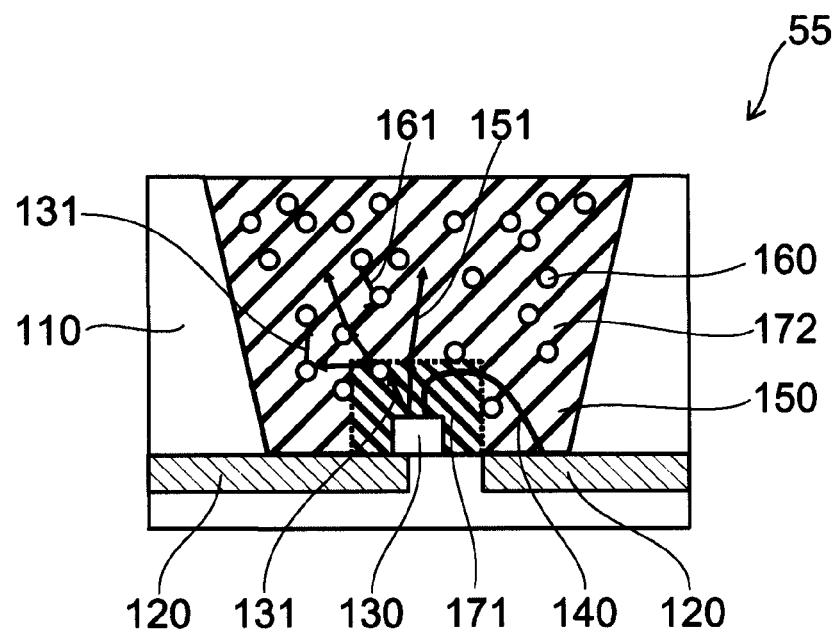
FIG. 10 is a schematic cross-sectional view illustrating the configuration of a light emitting device according to a fifth example of the invention.

FIG. 10 is a schematic cross-sectional view illustrating the configuration of a light emitting device according to a fifth example of the invention.

In the light emitting device 55 according to the fifth example of the invention illustrated in FIG. 10, the concentration of the second fluorescent material 160 in the first fluorescent material 150 is different between the region 171 proximal to the light source 130 and the region 172 distal to the light source 130. However, this configuration does not have a distinct boundary between the region 171 proximal to the light source and the region 172 distal to the light source.

In other words, in the light emitting device 55 according to the fifth example, the fluorescent substance B is disposed in the region 171 proximal to the light source in a package 110 similar to that of the third example, and the fluorescent substance C is disposed in the region 172 distal to the light source. Then, heating is performed to a temperature to melt the material forming the first fluorescent material 150 until the interface between the fluorescent substance B and the fluorescent substance C illustrated in FIG. 9 did not exist. Then, cooling is performed, and the light emitting device 55 according to this example is fabricated.

The light emitting device 55 is caused to emit light, and the color and the luminous flux of the light from the light emitting device 55 are measured. Light having a color of lamp, a color temperature of about 3,000 K, and a luminous flux of 3.5 lm is obtained.

Sixth Example

In a light emitting device 56 according to a sixth example, the material forming the first fluorescent material 150 used in the first example is disposed in the region 171 proximal to the light source in a package 110 similar to that used in the first example. The fluorescent substance C described in the third example is disposed in the region 172 distal to the light source. Then, heating is performed to a temperature to melt the first fluorescent material 150. Cooling is then performed, and the light emitting device 56 of this example is fabricated.

In other words, in the light emitting device 56 according to this example, the region 171 proximal to the light source did not contain the second fluorescent material 160, while the region 172 distal to the light source did contain the second fluorescent material 160. No distinct boundary existed between the region containing the second fluorescent material 160 and the region containing the second fluorescent material 160.

The light emitting device 56 is caused to emit light, and the color and the luminous flux of the light from the light emitting device 56 are measured. Light having a color of lamp, a color temperature of about 3,000 K, and a luminous flux of 3.7 lm is obtained.

Seventh Example

The fluorescent substance A described in the first example is dispersed at a concentration of 20% in a silicone resin SCR 1011 for photo devices made by Shin-Etsu Chemical Co., Ltd. and then disposed in a package 110 similar to that used in the first example. The entire package is heated by a heater to harden the silicone resin. Then, cooling is performed to room temperature, and a light emitting device 57 according to this example is fabricated.

A light emitting device 57 is caused to emit light, the color and the luminous flux of the light from the light emitting device 57 are measured, and a white light is obtained. Increasing the proportion of the first fluorescent material to produce light having a color of lamp and a color temperature of about 3,000 K resulted in a luminous flux of 2.6 lm.

Comparing the first example and the seventh example, the first example which used the second fluorescent material as the matrix of the light emitting layer had a higher luminous flux than the seventh example which used the silicone resin as the matrix of the light emitting layer.

Eighth Example

Each of the fluorescent substance B and the fluorescent substance C described in the third example is dispersed at a concentration of 20% in the silicone resin SCR 1011 to make a fluorescent component B1 and a fluorescent component C1, respectively. The fluorescent component B1 is disposed in the region 171 proximal to the light source in a package 110 similar to that used in the first example, and the fluorescent component C1 is disposed in the region 172 distal to the light source. Heating similar to that of the seventh example is performed. Cooling is then performed, and a light emitting device 58 according to this example is fabricated.

The light emitting device 58 is caused to emit light, and the color and the luminous flux of the light from the light emitting device 58 are measured. Light having a color of lamp, a color temperature of about 3,000 K, and a luminous flux of 2.7 lm is obtained.

Second Comparative Example

The 1:10 mixture of the material forming the second fluorescent material 160 and the material forming the first fluorescent material 150 described in the first example is dispersed at a concentration of 20% in the silicone resin SCR 1011 and disposed in a package 110 similar to that used in the first example. Heating similar to that of the seventh example is performed. Cooling is then performed, and a light emitting device of a second comparative example is fabricated.

The light emitting device of the second comparative example is caused to emit light, and the luminous flux of the light from the light emitting device is measured. Light having a color of lamp, a color temperature of about 3,000 K, and a luminous flux of 2.3 lm is obtained.

Comparing the seventh example and the second comparative example, the seventh example had a higher luminous flux. In other words, even in the case where fluorescent materials are dispersed in the matrix of the silicone resin, a higher luminous flux is obtained for the seventh example in which the second fluorescent material 160 is dispersed and incorporated in the first fluorescent material 150 which is then dispersed in the silicone resin than for the second comparative example in which the fluorescent materials are simply mixed in the silicone resin.

Third Comparative Example

Each of the 1:1 mixture and the 1:100 mixture of the material forming the second fluorescent material 160 and the material forming the first fluorescent material 150 described in the third example is dispersed at a concentration of 20% in the silicone resin SCR 1011 for photo devices made by Shin-Etsu Chemical Co., Ltd. to make a fluorescent component S1 and a fluorescent component S100, respectively. The fluorescent component S100 having a mixing concentration of 1:100 is disposed in the region 171 proximal to the light source in a package 110 similar to that used in the first example, and the fluorescent component S1 having a mixing concentration of 1:1 is disposed in the region 172 distal to the light source. Heating similar to that of the seventh example is performed. Cooling is then performed, and a light emitting device of a third comparative example is fabricated.

The light emitting device of the third comparative example is caused to emit light, and the color and the luminous flux of the light from the light emitting device are measured. Light having a color of lamp, a color temperature of about 3,000 K, and a luminous flux of 2.7 lm is obtained.

Fourth Comparative Example

The material forming the second fluorescent material 160 described in the first example is dispersed at a concentration of 20% in the silicone resin SCR 1011, and the material forming the first fluorescent material 150 described in the first example is dispersed at a concentration of 20% in the silicone resin SCR 1011. The dispersion of the material forming the second fluorescent material 160 is disposed in the region 171 proximal to the light source in a package 110 similar to that used in the first example, and the dispersion of the material forming the first fluorescent material 150 is disposed in the region 172 distal to the light source. Heating similar to that of the seventh example is performed. Cooling is then performed, and a light emitting device of a fourth comparative example is fabricated.

The light emitting device of the fourth comparative example is caused to emit light, and the color and the luminous flux of the light from the light emitting device are measured. Light having a color of lamp, a color temperature of about 3,000 K, and a luminous flux of 1.9 lm is obtained.

Fifth Comparative Example

The dispersion of the material forming the first fluorescent material 150 described in the fourth comparative example is disposed in the region 171 proximal to the light source, and the dispersion of the material forming the second fluorescent material 160 is disposed in the region 172 distal to the light source. Otherwise, a light emitting device of a fifth comparative example is fabricated similarly to that of the fourth comparative example.

The light emitting device of the fifth comparative example is caused to emit light, and the color and the luminous flux of the light from the light emitting device are measured. Light having a color of lamp, a color temperature of about 3,000 K, and a luminous flux of 2.4 lm is obtained.

Ninth Example

Figure 11:
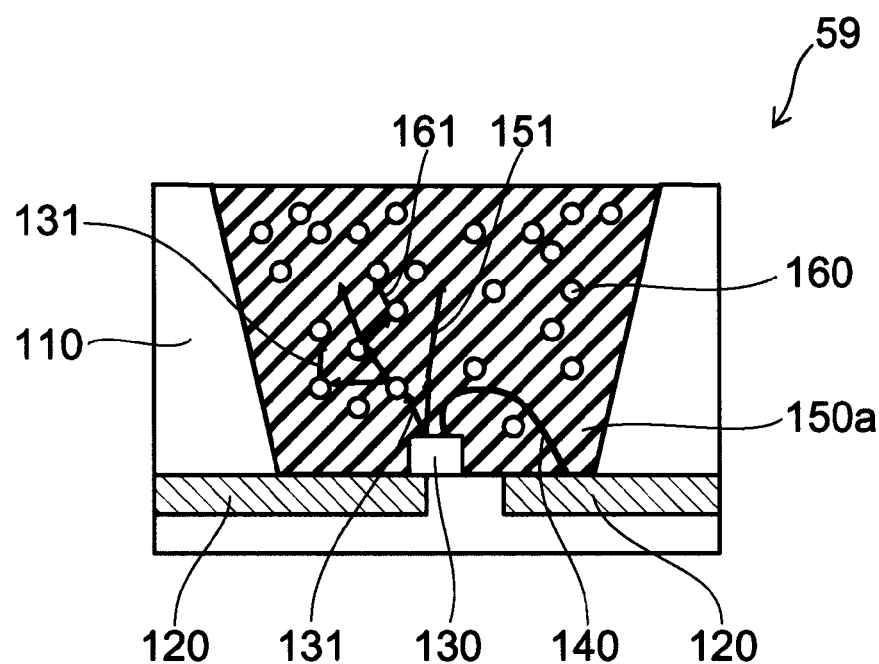
FIG. 11 is a schematic cross-sectional view illustrating the configuration of a light emitting device according to a ninth example of the invention.

FIG. 11 is a schematic cross-sectional view illustrating the configuration of a light emitting device according to a ninth example of the invention.

In the light emitting device 59 according to the ninth example of the invention illustrated in FIG. 11, the second fluorescent material 160 is dispersed and incorporated in a first fluorescent material 150a which included a third fluorescent material. In other words, the third fluorescent material described below is included in the first fluorescent material 150a.

In the light emitting device 59 according to this example, an element emitting violet light, namely, a light emitting element emitting light having wavelengths around 330 nm to 410 nm and a peak wavelength of 365 nm is used as the light source 130.

A granular fluorescent material of $(Ba, Ca, Mg, Sr)_{10}(PO_4)_6Cl_2:Eu$ emitting blue light is used as the second fluorescent material 160. A Tb (III) complex emitting green light and represented by chemical formula 3 is used as the first fluorescent material 150.

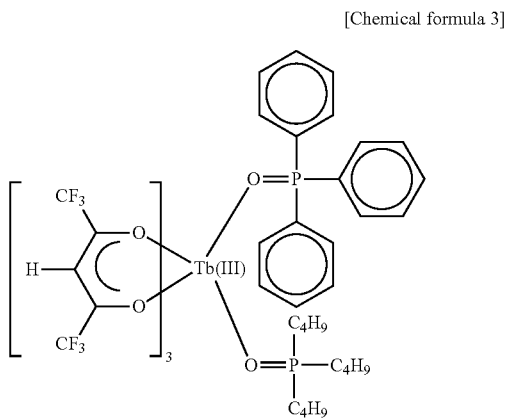

[Chemical formula 3]

The materials recited above forming the first fluorescent material 150 and the second fluorescent material 160 are disposed and fixed between quartz plates such that the material thickness is 0.2 mm. The absorptance is measured using an ultraviolet/visible spectrometer. The absorptance at a wavelength of 365 nm is 90% for the material forming the second fluorescent material 160 and 60% for the material forming the first fluorescent material 150.

In the light emitting device 59 according to this example, the Eu (III) complex emitting red light and represented in chemical formula 2 as described above is used as the third fluorescent material.

Ten parts by weight of the material forming the second fluorescent material 160 recited above, ten parts by weight of the material forming the first fluorescent material 150 recited above, and one part by weight of the material forming the third fluorescent material recited above are uniformly mixed in a mortar to fabricate a mixture having a weight ratio of 10:10:1.

The mixture is heated until the material forming the first fluorescent material 150 melted, and then the mixture is cooled. Thereby, a fluorescent substance D is fabricated in which the granular second fluorescent material 160 is dispersed and incorporated in the mass of the transparent first fluorescent material 150 including the third fluorescent material. The fluorescent substance D is disposed in the package 110, and the light emitting device 59 according to this example is fabricated.

The light emitting device 59 is caused to emit light, and the color and the luminous flux of the light from the light emitting device 59 are measured. Light having a color of natural light, a color temperature of about 5,000 K, and a luminous flux of 1.8 lm is produced.

Tenth Example

Using the mixing, the melting, and the cooling described in the ninth example, a fluorescent substance E is fabricated by dispersing and incorporating the second fluorescent material 160 in the first fluorescent material 150 including the third fluorescent material with a weight ratio of the material forming the second fluorescent material 160 to the material forming the first fluorescent material 150 to the material forming the third fluorescent material of 1:10:1. A fluorescent substance F is fabricated using similar methods by dispersing and incorporating the second fluorescent material 160 in the first fluorescent material 150 including the third fluorescent material with a weight ratio of the material forming the second fluorescent material 160 to the material forming the first fluorescent material 150 to the material forming the third fluorescent material of 100:10:1.

Then, a light emitting device 60 according to this example is fabricated by disposing the fluorescent substance E in the region 171 proximal to the light source in a package 110 similar to that described in the ninth example and disposing the fluorescent substance F in the region 172 distal to the light source.

The light emitting device 60 is caused to emit light, and the color and the luminous flux of the light from the light emitting device 60 are measured. Light having a color of natural light, a color temperature of about 5,000 K, and a luminous flux of 2.2 lm is obtained.

Eleventh Example

A light emitting device 61 according to an eleventh example is fabricated using a granular red fluorescent material of $Y_2(O, S)_3:Eu$ as the third fluorescent material. Otherwise, the light emitting device 61 is similar to that of the ninth example.

The light emitting device 61 is caused to emit light, and the color and the luminous flux of the light emitting device 61 are measured. Light having a color of natural light, a color temperature of about 5,000 K, and a luminous flux of 1.6 lm is obtained.

Sixth Comparative Example

A light emitting device of a sixth comparative example is fabricated by disposing the 10:10:1 mixture of the material forming the second fluorescent material 160, the material forming the first fluorescent material 150, and the material forming the third fluorescent material described in the ninth example in a package 110 similar to that described in the ninth example. In other words, unlike the ninth example, the materials are only mixed, and neither mixing in a mortar nor heating are performed. Therefore, in the light emitting device of the sixth comparative example, a powder mixture of the material forming the first fluorescent material, the material forming the second fluorescent material, and the material forming the third fluorescent material is used; and the second fluorescent material is not dispersed and incorporated in the first fluorescent material.

The light emitting device of the sixth comparative example is caused to emit light, and the color and the luminous flux of the light from the light emitting device are measured. Light having a color of natural light, a color temperature of about 5,000 K, and a luminous flux of 1.2 lm is obtained.

Twelfth Example

A light emitting device 62 according to a twelfth example is fabricated using a bluish-violet light emitting element as the light source 130 having a peak wavelength of 405 nm, a Eu (III) complex emitting a red light and represented by chemical formula 2 as the first fluorescent material 150, and a granular green fluorescent material of $BaMg_2Al_{16}O_{27}$:Eu, Mn as the third fluorescent material. Otherwise, the light emitting device 62 is similar to that of the ninth example.

The light emitting device 62 is caused to emit light, and the color and the luminous flux of the light from the light emitting device 62 are measured. Light having a color of natural light, a color temperature of about 5,000 K, and a luminous flux of 1.8 lm is obtained.

Fourth Embodiment

Figure 12:
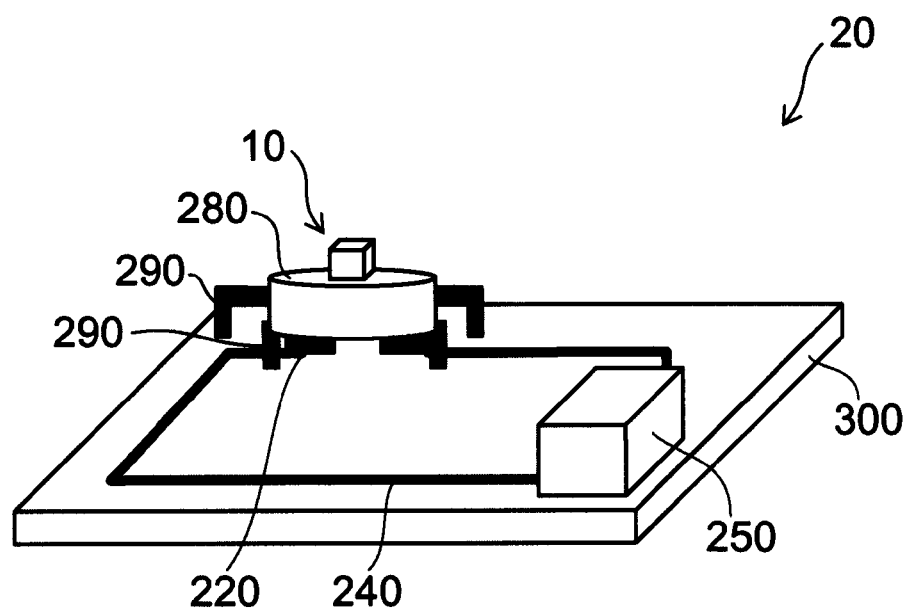
FIG. 12 is a schematic perspective view illustrating the configuration of a light emitting apparatus according to a fourth embodiment of the invention.

FIG. 12 is a schematic perspective view illustrating the configuration of a light emitting apparatus according to a fourth embodiment of the invention.

The light emitting apparatus 20 according to the fourth embodiment of the invention illustrated in FIG. 12 includes the light emitting device 10 according to the first embodiment of the invention and an electronic circuit 250 connected to the light source 130 of the light emitting device 10 to supply current to the light source 130.

Although the light emitting device 10 according to the first embodiment is used in the specific example illustrated in FIG. 12, the invention is not limited thereto. Any light emitting device according to the embodiments and the examples recited above may be used. The light emitting device 10 is used in the following descriptions for convenience.

In the light emitting apparatus 20, the light emitting device 10 and the electronic circuit 250 are disposed on, for example, a circuit substrate 300. The light emitting device 10 is stored in, for example, a socket 280. The socket 280 is fixed on the circuit substrate 300 by a socket fixture 290. In the interior of the socket 280, a current providing unit 220 connects to electrodes of the light source 130 (not illustrated) of the light emitting device 10 and connects to one side of wiring 240 provided on the circuit substrate 300. The other side of the wiring 240 connects to the electronic circuit 250. Thereby, the electronic circuit 250 supplies current to the light source 130 of the light emitting device 10.

The electronic circuit 250 may include an inductor, and may include a controller for controlling ON and OFF, the amount of light, the lighting time interval, etc., of the light emitting device 10. The electronic circuit 250 may change the current supplied to the light emitting device 10 or the voltage, frequency, duty ratio, and the like to control the light emission characteristics of the light emitting device 10.

The light emitting apparatus 20 according to this embodiment uses a light emitting device according to this embodiment and therefore can emit light of the desired light-emission color with high efficiency and high luminous flux. The light emitting apparatus can easily control the light emission characteristics by the electronic circuit 250.

Although the light emitting device 10 and the electronic circuit 250 are connected via the wiring 240 and the current providing unit 220 of the socket 280 in this specific example, the invention is not limited thereto. The light emitting device 10 may connect directly to the electronic circuit 250. Although the light emitting device 10 is fixed to the circuit substrate 300 via the socket 280 and the socket fixture 290 in this specific example, the light emitting device 10 may be fixed directly to the circuit substrate 300; or the light emitting device 10 may be fixed directly to the electronic circuit 250 without using the circuit substrate 300.

To provide stable control of the current, voltage, etc., supplied to the light emitting device 10, it is desirable to stabilize the light emitting device 10 by fixing on the circuit substrate 300 by an appropriate socket 280, soldering, etc., as in this specific example.

To prevent shorts in this specific example, it is favorable to use an insulative circuit substrate 300 and socket 280, and more favorable to use a configuration of ceramic materials including $SiO_2$, AlN, and the like to improve heat dissipation.

Figure 13:
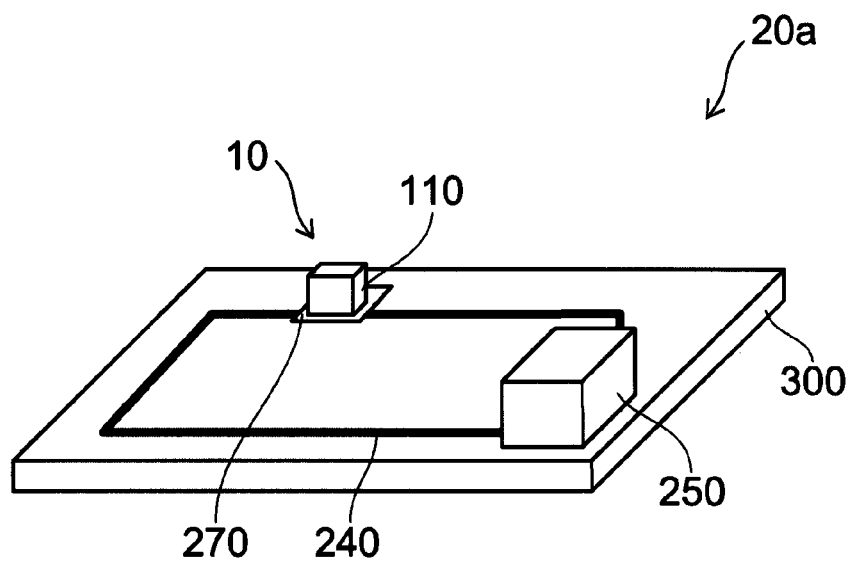
FIG. 13 is a schematic perspective view illustrating the configuration of another light emitting apparatus according to the fourth embodiment of the invention.

FIG. 13 is a schematic perspective view illustrating the configuration of another light emitting apparatus according to the fourth embodiment of the invention.

In the light emitting apparatus 20a according to the fourth embodiment of the invention illustrated in FIG. 13, the package 110 of the light emitting device 10 itself is fit into and fixed in a package receptacle 270 provided on the circuit substrate 300. The electrodes of the light source 130 (not illustrated) of the light emitting device 10 connect to one side of the wiring 240. The other side of the wiring 240 connects to the electronic circuit 250. Thereby, the electronic circuit 250 supplies current to the light source 130 of the light emitting device 10.

To prevent shorts in this specific example, it is favorable to use an insulative circuit substrate 300 and package 110, and more favorable to use a configuration of ceramic materials including $SiO_2$, AlN, and the like to improve heat dissipation.

Figure 14:
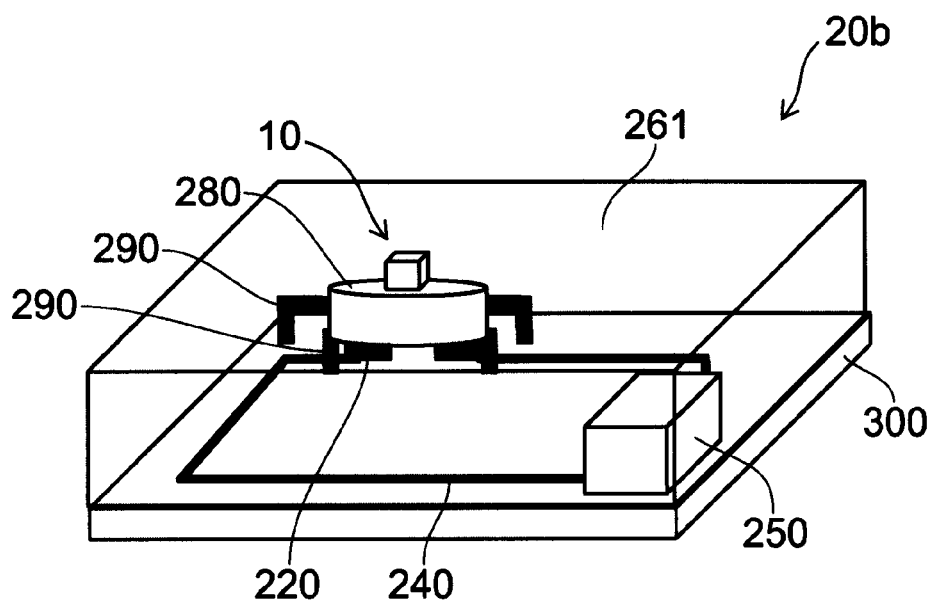
FIG. 14 is a schematic perspective view illustrating the configuration of another light emitting apparatus according to the fourth embodiment of the invention.

FIG. 14 is a schematic perspective view illustrating the configuration of another light emitting apparatus according to the fourth embodiment of the invention.

In the light emitting apparatus 20b according to the fourth embodiment of the invention illustrated in FIG. 14, a moisture resisting cover 261 covers the light emitting device 10. In other words, the light emitting apparatus 20b is a light emitting apparatus 20 in which a moisture resisting cover 261 is provided above the light emitting device 10 and the electronic circuit 250. However, the moisture resisting cover 261 may be provided to cover the first fluorescent material 150 and the second fluorescent material 160.

Restated, the light emitting apparatus 20b according to this embodiment further includes a moisture resisting cover 261 provided on a side of the first and second fluorescent materials 150 and 160 opposite the light source 130 to protect at least one of the first and second fluorescent materials 150 and 160 from moisture.

Thereby, the first fluorescent material 150 and the second fluorescent material 160 of the light emitting device 10 can be protected against moisture, and a light emitting apparatus having high reliability and good characteristics can be provided.

The moisture resisting cover 261 may include the various materials and configurations described in regard to the moisture resisting cover 260 described in the third embodiment.

Figure 15:
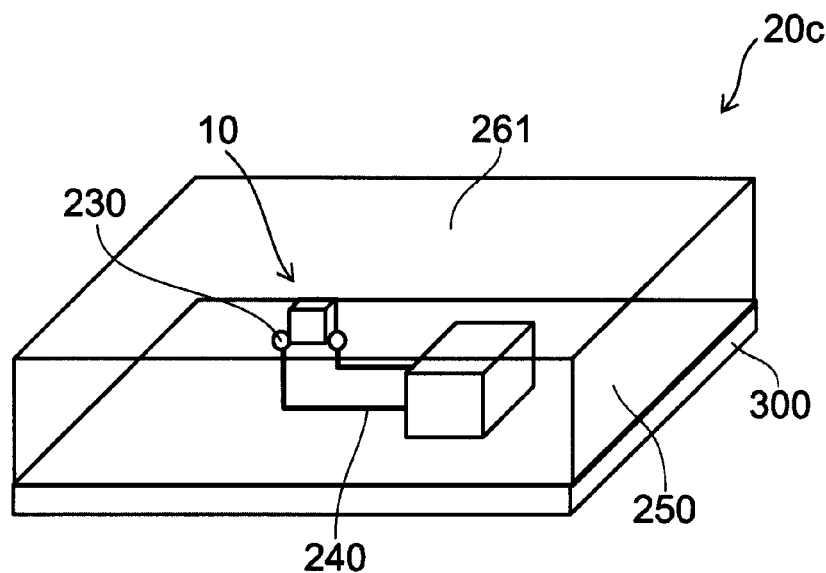
FIG. 15 is a schematic perspective view illustrating the configuration of another light emitting apparatus according to the fourth embodiment of the invention.

FIG. 15 is a schematic perspective view illustrating the configuration of another light emitting apparatus according to the fourth embodiment of the invention.

In the light emitting apparatus 20c according to the fourth embodiment of the invention illustrated in FIG. 15, the light emitting device 10 and the electronic circuit 250 are provided on the circuit substrate 300, and the moisture resisting cover 261 is provided above the light emitting device 10 and the electronic circuit 250. In this specific example, the light emitting device 10 is connected to the electronic circuit 250 and fixed to the circuit substrate 300 by solder 230.

Thus, the method for connecting the light emitting device 10 to the electronic circuit 250 and the method for fixing the light emitting device 10 to the circuit substrate 300 are arbitrary.

Figure 16:
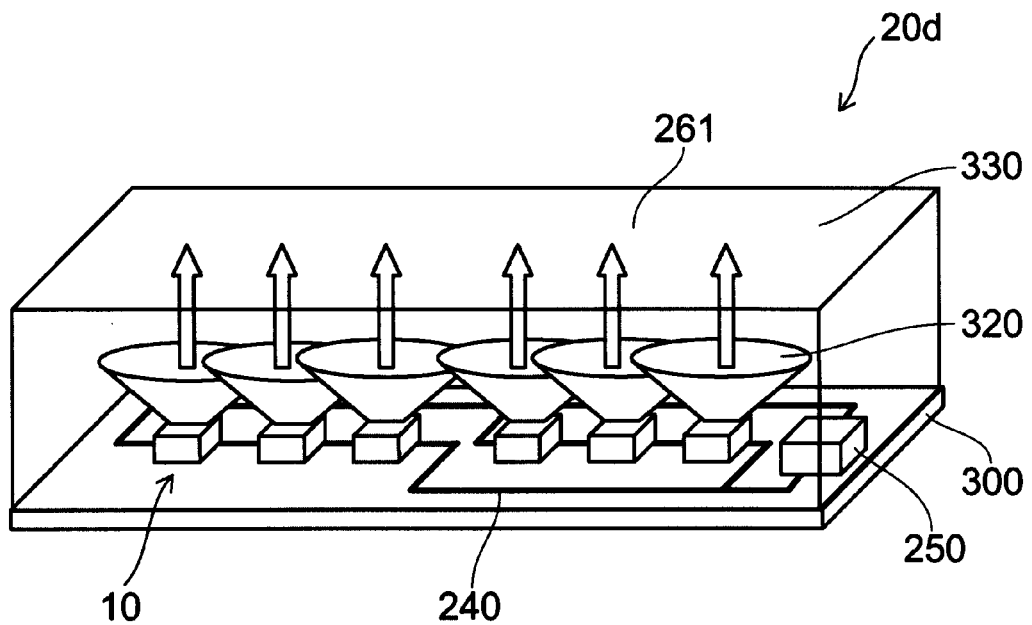
FIG. 16 is a schematic perspective view illustrating the configuration of another light emitting apparatus according to the fourth embodiment of the invention.

FIG. 16 is a schematic perspective view illustrating the configuration of another light emitting apparatus according to the fourth embodiment of the invention.

Multiple light emitting devices 10 are provided in the light emitting apparatus 20d according to the fourth embodiment of the invention illustrated in FIG. 16. Multiple light emitting devices 10 and an electronic circuit 250 are provided on the circuit substrate 300, and the moisture resisting cover 261 is provided above the light emitting devices 10 and the electronic circuit 250. Although the multiple light emitting devices 10 are fixed to the circuit substrate 300 by sockets in this specific example, the disposition method is arbitrary. The light emitting devices 10 may be fixed directly to the circuit substrate 300 by solder, etc.

LEDs and the like may be used as the light emitting devices of the light emitting apparatus according to this embodiment. The size and brightness of one LED is limited. A light emitting apparatus requiring a high luminous flux and/or a large surface area may use multiple LEDs to realize the desired luminous flux and/or surface area exceeding the luminous flux and/or surface area of one LED.

Thus, the light emitting apparatus 20d according to this embodiment can provide the desired luminous flux and light emission surface area.

Multiple LEDs may be arranged to increase the luminous flux of a light emitting surface in the case where the light emitting surface has a planar or curved configuration in a prescribed orientation such as in ceiling illumination, illumination which is set inside a wall, etc. The orientation may be different according to the configuration of the light emitting surface.

In the case where the light emitting apparatus includes a transparent and moisture-resistant cover, protective layer, etc., such as the moisture resisting cover 261, the degree of scatter and refraction of light changes due to changes in the material qualities, thickness, and configuration thereof. Therefore, the arrangement and orientation of the light emitting devices can be appropriately set to suit the degree of scatter and refraction of light.

In the light emitting apparatus 20d of this specific example, one face of the moisture resisting cover 261 is the designed light emitting surface 330 of the light emitting apparatus 20d. Optical paths 320 of light from the light emitting devices 10 (LEDs) are uniformly incident on the light emitting surface 330. The light emitting devices 10 (LEDs) are arranged in a planar configuration to brightly illuminate the light emitting surface 330.

Figure 17:
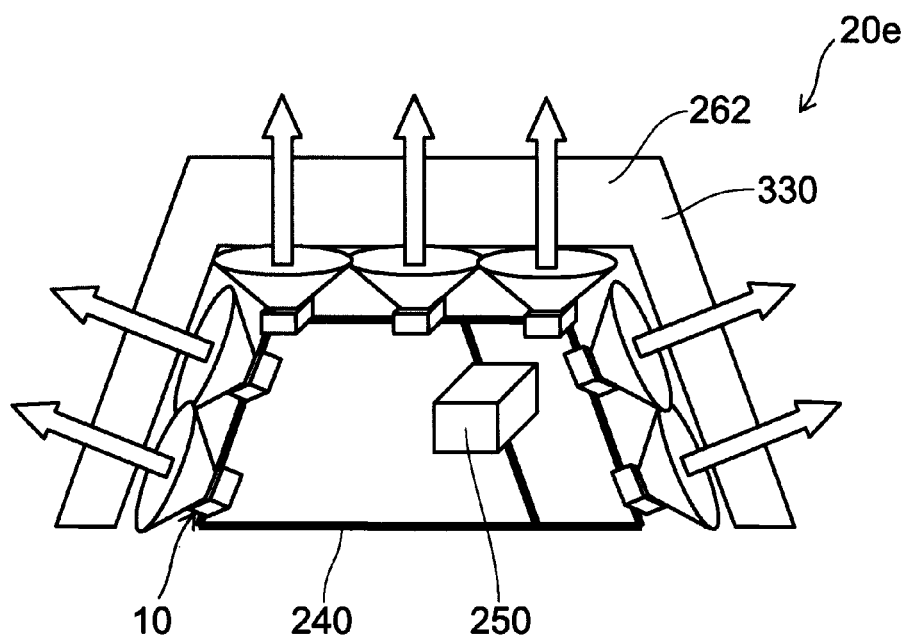
FIG. 17 is a schematic perspective view illustrating the configuration of another light emitting apparatus according to the fourth embodiment of the invention.

FIG. 17 is a schematic perspective view illustrating the configuration of another light emitting apparatus according to the fourth embodiment of the invention.

Multiple light emitting devices 10 are provided in the light emitting apparatus 20e according to the fourth embodiment of the invention illustrated in FIG. 17. A transparent cover 262 of the light emitting apparatus 20e has a trapezoidal configuration. Three sides of the transparent cover 262 form the designed light emitting surface 330. The optical paths 320 of light from the light emitting devices 10 (LEDs) are uniformly incident on the light emitting surface 330, and the light emitting devices 10 (LEDs) are arranged three dimensionally to brightly illuminate the light emitting surface 330.

In the configuration recited above, the moisture resisting cover 261 may be used as the transparent cover 262 to protect the first fluorescent material 150 and the second fluorescent material 160 from moisture.

Figure 18:
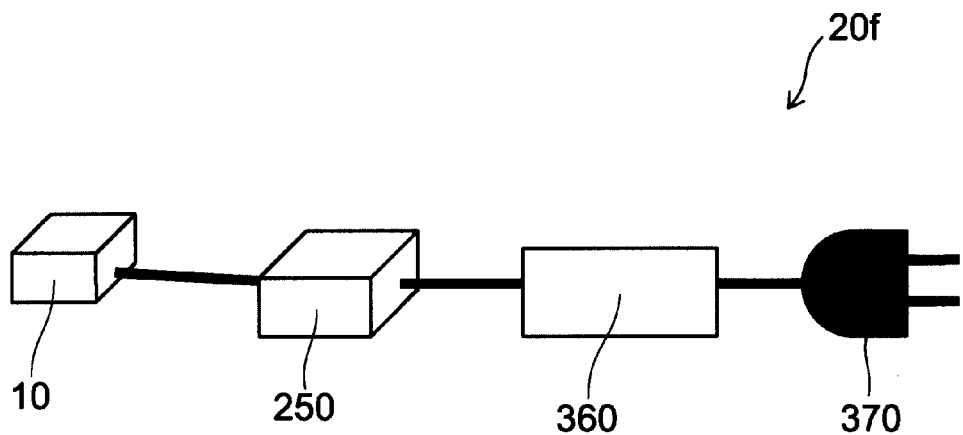
FIG. 18 is a schematic view illustrating the configuration of another light emitting apparatus according to the fourth embodiment of the invention.

FIG. 18 is a schematic view illustrating the configuration of another light emitting apparatus according to the fourth embodiment of the invention.

The light emitting apparatus 20f according to the fourth embodiment of the invention illustrated in FIG. 18 further includes a direct current/alternating current converter 360 and an alternating current socket plug 370 connected to the direct current/alternating current converter 360 in addition to the light emitting device 10 and the electronic circuit 250.

General light emitting apparatuses used for illumination in homes and offices are generally connected to an alternating-current power source. On the other hand, LEDs and the like operating on direct current are used as light sources of light emitting apparatuses according to this embodiment and light emitting devices used therein. In such a case, as in this specific example, the alternating current socket plug 370 can be connected to an alternating-current power source to provide a convenient light emitting apparatus by providing the direct current/alternating current converter 360 to convert alternating voltage to direct voltage. It is desirable to provide such an electronic circuit.

Figure 19:
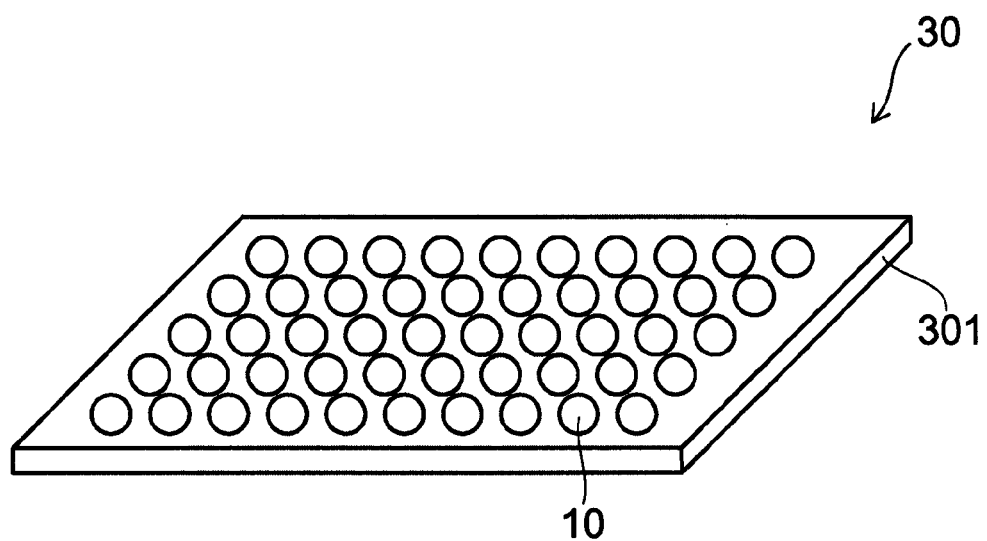
FIG. 19 is a schematic view illustrating the configuration of another light emitting apparatus according to the fourth embodiment of the invention.

FIG. 19 is a schematic view illustrating the configuration of another light emitting apparatus according to the fourth embodiment of the invention.

In the light emitting apparatus 30 according to the fourth embodiment of the invention illustrated in FIG. 19, the light emitting devices 10 according to the first embodiment of the invention are multiply disposed.

In other words, the light emitting devices 10 are disposed, for example, on a major surface of a substrate 301 to line up in a vertical direction and a horizontal direction. Any desired figure, character, etc., is displayed by changing the light emission states of the light emitting devices 10 in a prescribed location and the light emitting devices 10 in a location outside of the prescribed location. In other words, the light emitting apparatus 30 is a dot matrix display apparatus.

Although the light emitting device 10 according to the first embodiment is used in the specific example illustrated in FIG. 19, the invention is not limited thereto. Any light emitting device according to the embodiments and the examples recited above may be used.

An electronic circuit (not illustrated) may be provided in the light emitting apparatus 30 to supply current to the light source of the light emitting device 10. A direct current/alternating current converter and/or an alternating current socket plug connected to the electronic circuit also may be provided. The moisture resisting cover 261 and/or the transparent cover 262 also may be provided.

The light emitting apparatus 30 according to this embodiment uses light emitting devices according to this embodiment and therefore displays the desired light-emission color with high efficiency and high luminous flux.

Thus, the light emitting apparatus according to the embodiments of the invention can be applied to various light emitting apparatuses such as illumination apparatuses and display apparatuses.

Figure 20:
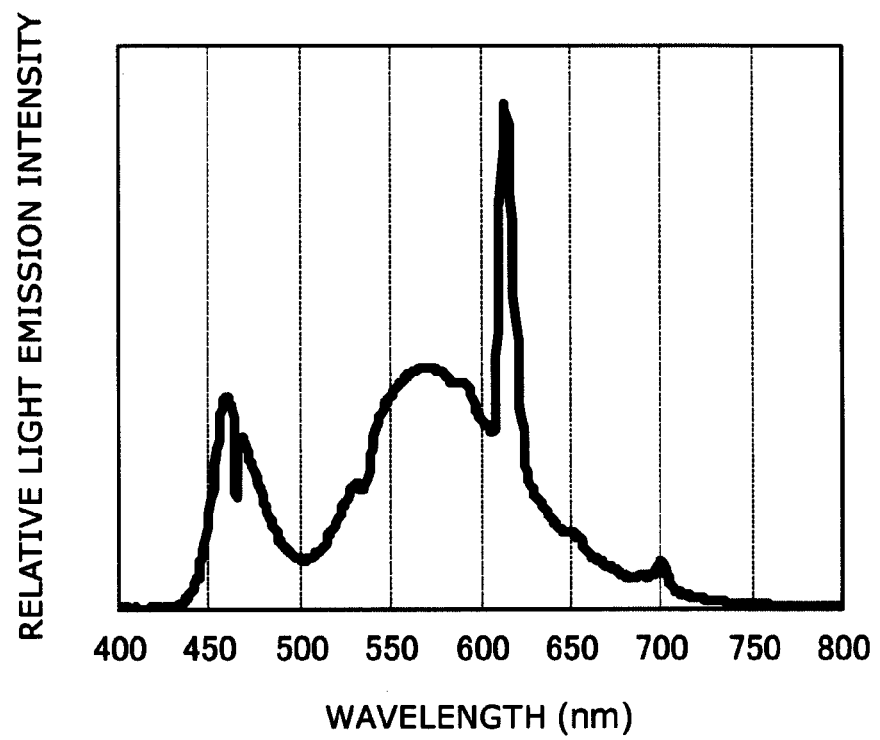
FIG. 20 is a graph illustrating a characteristic of a light emitting device and a light emitting apparatus according to embodiments of the invention.

FIG. 20 is a graph illustrating a characteristic of a light emitting device and a light emitting apparatus according to embodiments of the invention.

Namely, the wavelength is plotted on the horizontal axis of FIG. 20, and the relative light emission intensity is plotted on the vertical axis.

As illustrated in FIG. 20, the light emitting device and the light emitting apparatus according to the embodiments of the invention can emit white light. However, this characteristic is one specific example. The light emitting devices and the light emitting apparatuses according to the invention can be designed to emit various types of white light and non-white light.

Hereinabove, exemplary embodiments of the invention are described with reference to specific examples. However, the invention is not limited to these specific examples. For example, one skilled in the art may appropriately select specific configurations of components of a light emitting device and a light emitting apparatus from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all light emitting devices and light emitting apparatuses that can be obtained by an appropriate design modification by one skilled in the art based on the light emitting devices and the light emitting apparatuses described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A light emitting device, comprising:
   a light source;
   a first fluorescent material consisting of an organic fluorescent dye, the organic fluorescent dye absorbing a light-source light radiated by the light source and radiating a first light, a wavelength of the first light being different from a wavelength of the light-source light; and
   a second fluorescent material dispersedly provided in the first fluorescent material, the second fluorescent material absorbing the light-source light and radiating a second light,
   an absorptance of the light-source light in the second fluorescent material being higher than an absorptance of the light-source light in the organic fluorescent dye, and
   a wavelength of the second light being different from the wavelength of the light-source light and different from the wavelength of the first light.

2. The device according to claim 1, wherein a concentration of the second fluorescent material in the first fluorescent material is higher on a side distal to the light source than on a side proximal to the light source.

3. The device according to claim 1, wherein a portion of the first fluorescent material is disposed on a side farther to the light source than the second fluorescent material.

4. The device according to claim 1, wherein the first fluorescent material is in one of a liquid state, an amorphous state, or a gel state.

5. The device according to claim 1, wherein the first fluorescent material includes a hydrocarbon group.

6. The device according to claim 1, wherein the light source includes a semiconductor light emitting element.

7. The device according to claim 1, wherein a peak light emission wavelength of the light source is in a range of 240 nanometers to 480 nanometers.

8. The device according to claim 1, wherein the wavelength of the second light is longer than the wavelength of the light-source light.

9. The device according to claim 1, wherein the wavelength of the first light is longer than the wavelength of the second light.

10. The device according to claim 1, wherein at least one of the first and second fluorescent materials include a third fluorescent material absorbing the light-source light and radiating a third light having a wavelength different from the wavelength of the light-source light, the wavelength of the first light, and the wavelength of the second light.

11. The device according to claim 1, further comprising a light transmitting layer provided between the light source and the first fluorescent material and between the light source and the second fluorescent material, the light transmitting layer transmitting the light-source light.

12. The device according to claim 1, further comprising a moisture resisting cover provided on a side of the first and second fluorescent materials opposite to the light source, the moisture resisting cover protecting at least one of the first and second fluorescent materials against moisture.

13. The device according to claim 1, wherein the light-source light passes through the first fluorescent material and the second fluorescent material multiple times.

14. The device according to claim 1, wherein the light-source light is a blue light, the first light is a red light, and the second light is a yellow light.

15. The device according to claim 1, wherein the light-source light, the first light, and the second light synthesize to produce a white light.

16. The device according to claim 1, wherein the light source emits light having a wavelength capable of exciting a fluorescent material.

17. The device according to claim 1, wherein the light source is at least one selected from a group consisting of a combustible light source, a discharge tube, an inorganic EL, an organic EL, a semiconductor light emitting element, and a light emitting unit extracting a wavelength region by an optical component, the one emitting an ultraviolet, near-ultraviolet, violet, bluish-violet, or blue light.

18. The device according to claim 1, wherein the second fluorescent material includes at least one selected from a group consisting of:
$(Ba, Eu, Sr)(Mg, Mn)Al_{10}O_{17}$;
$(Ba, Ca, Mg, Sr)_{10}(PO_4)_6Cl_2:Eu$;
$(Ba, Ca, Sr)SiO_4:Eu$;
$(Ba, Ca, Mg, Sr)AlSiN_3:Eu$;
$(Ba, Ca, Sr)_2Si_5N_8:Eu$;
$(Ca, Sr)(Al, Ga)_2S_4:Eu, Tb$;
$(Y, Gd)_3(Al, Ga)_5O_{12}:Ce, Eu, Tb$;
$(Y, La, Gd, Eu)_2(O, S)_3:Eu, Tb$;
$(Y, Gd)BO_3:Ce, Eu$;
$(Zn, Mn)_2SiO_4:Mn$;
$(Mg, Zn, Cd)(O, S, Se)$;
$(Zn, Cd)S:Ag, Cu, Al$;
$(Al, Ga, In)(N, P, As)$;
$BaAl_{12}O_{19}:Mn$;
$BaMg_2Al_{16}O_{27}:Eu$;
$LaPO_4:Ce, Tb$;
$SiAl_2O_2N_2:Eu$;
$Y_2SiO_5:Tb$; and
$YVO_4:Eu$.

19. A light emitting apparatus, comprising:
a light emitting device; and
an electronic circuit,
the light emitting device including:
  a light source;
  a first fluorescent material consisting of an organic fluorescent dye absorbing a light-source light radiated by the light source and radiating a first light, a wavelength of the first light being different from a wavelength of the light-source light; and
  a second fluorescent material dispersedly provided in the first fluorescent material, the second fluorescent material absorbing the light-source light and radiating a second light,
  an absorptance of the light-source light in the second fluorescent material being higher than an absorptance of the light-source light in the organic fluorescent dye, and
  a wavelength of the second light being different from the wavelength of the light-source light and different from the wavelength of the first light, and
the electronic circuit being connected to the light source to supply a current to the light source.

20. The apparatus according to claim 19, wherein the light emitting device further includes a moisture resisting cover provided on a side of the first and second fluorescent materials opposite to the light source, the moisture resisting cover protecting at least one of the first and second fluorescent materials against moisture.

21. The device according to claim 1, wherein the organic fluorescent dye includes a compound of

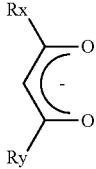

wherein Rx is selected form one of a t-butyl group, 2-methyl-2-pentyl group, 2-phenyl-2-propyl group, adamantyl group, a phenyl group, naphtyl group, cyclopentadiene group, pyridyl group, pyrrolyl group, thienyl group, a trifluoromethyl group and heptafluoropropyl group, and Ry is selected form one of a t-butyl group, 2-methyl-2-pentyl group, 2-phenyl-2-propyl group, adamantyl group, a phenyl group, naphtyl group, cyclopentadiene group, pyridyl group, pyrrolyl group, thienyl group, a trifluoromethyl group and heptafluoropropyl group.

22. The apparatus according to claim 19, wherein the organic fluorescent dye includes a compound of

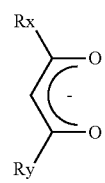

wherein Rx is selected form one of a t-butyl group, 2-methyl-2-pentyl group, 2-phenyl-2-propyl group, adamantyl group, a phenyl group, naphtyl group, cyclopentadiene group, pyridyl group, pyrrolyl group, thienyl group, a trifluoromethyl group and heptafluoropropyl group, and Ry is selected form one of a t-butyl group, 2-methyl-2-pentyl group, 2-phenyl-2-propyl group, adamantyl group, a phenyl group, naphtyl group, cyclopentadiene group, pyridyl group, pyrrolyl group, thienyl group, a trifluoromethyl group and heptafluoropropyl group.

* * * * *